(12) United States Patent
Whittaker et al.

(10) Patent No.: US 12,206,385 B2
(45) Date of Patent: Jan. 21, 2025

(54) SYSTEMS AND METHODS FOR COUPLING A SUPERCONDUCTING TRANSMISSION LINE TO AN ARRAY OF RESONATORS

(71) Applicant: D-WAVE SYSTEMS INC., Burnaby (CA)

(72) Inventors: Jed D. Whittaker, Vancouver (CA); Loren J. Swenson, San Jose, CA (US); Mark H. Volkmann, Burnaby (CA)

(73) Assignee: D-WAVE SYSTEMS INC., Burnaby (CA)

( * ) Notice: Subject to any disclaimer, the term of this patent is extended or adjusted under 35 U.S.C. 154(b) by 227 days.

(21) Appl. No.: 17/862,605

(22) Filed: Jul. 12, 2022

(65) Prior Publication Data

US 2023/0006324 A1 Jan. 5, 2023

Related U.S. Application Data

(63) Continuation of application No. 16/975,646, filed as application No. PCT/US2019/018792 on Feb. 20, 2019, now Pat. No. 11,424,521.

(Continued)

(51) Int. Cl.
*H03H 7/38* (2006.01)
*G06N 10/00* (2022.01)
(Continued)

(52) U.S. Cl.
CPC ............. *H03H 7/383* (2013.01); *G06N 10/00* (2019.01); *H01P 1/20381* (2013.01); *H10N 60/12* (2023.02)

(58) Field of Classification Search
CPC .... H01L 39/223; H03H 7/383; H01P 1/20381
(Continued)

(56) References Cited

U.S. PATENT DOCUMENTS 4,275,314 A 6/1981 Fulton
4,785,426 A 11/1988 Harada et al.
(Continued)

FOREIGN PATENT DOCUMENTS

CN 106505962 A 3/2017
JP 2011524043 A 8/2011
(Continued)

OTHER PUBLICATIONS

Boothby et al., "Architectural considerations in the design of a third-generation superconducting quantum annealing processor", arXiv: 2108.02322v1, Aug. 2021, pp. 3-4; and figure 4.
(Continued)

*Primary Examiner* — Rakesh B Patel
(74) *Attorney, Agent, or Firm* — Cozen O'Connor

(57) ABSTRACT

A superconducting circuit may include a transmission line having at least one transmission line inductance, a superconducting resonator, and a coupling capacitance that communicatively couples the superconducting resonator to the transmission line. The transmission line inductance may have a value selected to at least partially compensate for a variation in a characteristic impedance of the transmission line, the variation caused at least in part by the coupling capacitance. The coupling capacitance may be distributed along the length of the transmission line. A superconducting circuit may include a transmission line having at least one transmission line capacitance, a superconducting resonator, and a coupling inductance that communicatively couples the superconducting resonator to the transmission line. The transmission line capacitance may be selected to at least partially compensate for a variation in coupling strength between the superconducting resonator and the transmission line.

14 Claims, 12 Drawing Sheets

Related U.S. Application Data

(60) Provisional application No. 62/636,043, filed on Feb. 27, 2018.

(51) Int. Cl.
   *H01P 1/203* (2006.01)
   *H10N 60/12* (2023.01)

(58) Field of Classification Search
   USPC .................................. 333/202–205, 99 S
   See application file for complete search history.

(56) References Cited

U.S. PATENT DOCUMENTS

| | | |
|---|---|---|
| 4,947,118 A | 8/1990 | Fujimaki |
| 5,153,171 A | 10/1992 | Smith et al. |
| 5,248,941 A | 9/1993 | Lee et al. |
| 5,528,202 A | 6/1996 | Moline et al. |
| 6,356,078 B1 | 3/2002 | Ganther et al. |
| 6,437,413 B1 | 8/2002 | Yamaguchi et al. |
| 6,597,010 B2 | 7/2003 | Eriksson et al. |
| 6,627,915 B1 | 9/2003 | Ustinov et al. |
| 6,627,916 B2 | 9/2003 | Amin et al. |
| 6,670,630 B2 | 12/2003 | Blais et al. |
| 6,784,451 B2 | 8/2004 | Amin et al. |
| 6,822,255 B2 | 11/2004 | Tzalenchuk et al. |
| 6,838,694 B2 | 1/2005 | Esteve et al. |
| 6,885,325 B2 | 4/2005 | Omelyanchouk et al. |
| 6,897,468 B2 | 5/2005 | Blais et al. |
| 6,900,454 B2 | 5/2005 | Blais et al. |
| 6,943,368 B2 | 9/2005 | Amin et al. |
| 6,960,780 B2 | 11/2005 | Blais et al. |
| 6,979,836 B2 | 12/2005 | Zagoskin et al. |
| 6,984,846 B2 | 1/2006 | Newns et al. |
| 6,987,282 B2 | 1/2006 | Amin et al. |
| 7,015,499 B1 | 3/2006 | Zagoskin |
| 7,018,852 B2 | 3/2006 | Wu et al. |
| 7,042,005 B2 | 5/2006 | Il et al. |
| 7,109,593 B2 | 9/2006 | Freedman et al. |
| 7,135,701 B2 | 11/2006 | Amin et al. |
| 7,253,654 B2 | 8/2007 | Amin |
| 7,277,872 B2 | 10/2007 | Raussendorf et al. |
| 7,332,738 B2 | 2/2008 | Blais et al. |
| 7,335,909 B2 | 2/2008 | Amin et al. |
| 7,418,283 B2 | 8/2008 | Amin |
| 7,533,068 B2 | 5/2009 | Maassen et al. |
| 7,619,437 B2 | 11/2009 | Thom et al. |
| 7,624,088 B2 | 11/2009 | Johnson et al. |
| 7,639,035 B2 | 12/2009 | Berkley |
| 7,675,139 B2 | 3/2010 | Nomura et al. |
| 7,843,209 B2 | 11/2010 | Berkley |
| 7,876,248 B2 | 1/2011 | Berkley et al. |
| 7,880,529 B2 | 2/2011 | Amin |
| 7,898,282 B2 | 3/2011 | Harris et al. |
| 7,932,514 B2 | 4/2011 | Farinelli et al. |
| 7,969,805 B2 | 6/2011 | Thom et al. |
| 7,981,759 B2 | 7/2011 | Cervin-Lawry et al. |
| 7,990,662 B2 | 8/2011 | Berkley et al. |
| 8,008,942 B2 | 8/2011 | Van et al. |
| 8,018,244 B2 | 9/2011 | Berkley |
| 8,035,540 B2 | 10/2011 | Berkley et al. |
| 8,098,179 B2 | 1/2012 | Bunyk et al. |
| 8,169,231 B2 | 5/2012 | Berkley |
| 8,190,548 B2 | 5/2012 | Choi |
| 8,195,596 B2 | 6/2012 | Rose et al. |
| 8,228,688 B2 | 7/2012 | Uchaykin et al. |
| 8,283,943 B2 | 10/2012 | Van Den Brink et al. |
| 8,355,765 B2 | 1/2013 | Uchaykin et al. |
| 8,421,053 B2 | 4/2013 | Bunyk et al. |
| 8,494,993 B2 | 7/2013 | Harris et al. |
| 8,536,566 B2 | 9/2013 | Johansson et al. |
| 8,686,751 B2 | 4/2014 | Van Den Brink et al. |
| 8,700,689 B2 | 4/2014 | MacReady et al. |
| 8,786,476 B2 | 7/2014 | Bunyk et al. |
| 8,812,066 B2 | 8/2014 | Lanting et al. |
| 8,854,074 B2 | 10/2014 | Berkley |
| 8,933,695 B1 | 1/2015 | Kornev et al. |
| 8,951,808 B2 | 2/2015 | Ladizinsky et al. |
| 9,015,215 B2 | 4/2015 | Berkley et al. |
| 9,069,928 B2 | 6/2015 | Van Den Brink et al. |
| 9,183,508 B2 | 11/2015 | King |
| 9,335,385 B2 | 5/2016 | Lanting et al. |
| 9,361,169 B2 | 6/2016 | Berkley |
| 9,471,880 B2 | 10/2016 | Williams |
| 9,495,644 B2 | 11/2016 | Chudak et al. |
| 9,501,748 B2 | 11/2016 | Naaman et al. |
| 9,509,274 B2 | 11/2016 | Naaman et al. |
| 9,727,823 B2 | 8/2017 | Amin et al. |
| 9,768,371 B2 | 9/2017 | Ladizinsky et al. |
| 9,893,262 B2 | 2/2018 | Thompson et al. |
| 10,037,493 B2 | 7/2018 | Harris et al. |
| 10,050,630 B2 | 8/2018 | Reagor et al. |
| 10,074,792 B1 | 9/2018 | Ferguson et al. |
| 10,235,635 B1 | 3/2019 | Abdo |
| 10,290,425 B2 | 5/2019 | Shindo et al. |
| 10,333,047 B2 | 6/2019 | Gilbert et al. |
| 10,381,542 B2 | 8/2019 | Chang et al. |
| 10,404,214 B2 | 9/2019 | Szöcs et al. |
| 10,516,375 B2 | 12/2019 | Bell et al. |
| 10,528,886 B2 | 1/2020 | Boothby |
| 10,811,588 B2 | 10/2020 | Olivadese et al. |
| 10,938,346 B2 | 3/2021 | Berkley et al. |
| 10,943,180 B2 | 3/2021 | Abdo |
| 11,100,416 B2 | 8/2021 | Lanting et al. |
| 11,127,893 B2 | 9/2021 | Johnson et al. |
| 11,295,225 B2 | 4/2022 | Hoskinson et al. |
| 11,422,958 B2 | 8/2022 | Boothby et al. |
| 11,424,521 B2 | 8/2022 | Whittaker et al. |
| 2002/0121636 A1 | 9/2002 | Amin et al. |
| 2002/0188578 A1 | 12/2002 | Amin et al. |
| 2002/0190381 A1 | 12/2002 | Herr et al. |
| 2003/0055513 A1 | 3/2003 | Raussendorf et al. |
| 2003/0107033 A1 | 6/2003 | Tzalenchuk et al. |
| 2003/0121028 A1 | 6/2003 | Coury et al. |
| 2003/0169041 A1 | 9/2003 | Coury et al. |
| 2003/0173498 A1 | 9/2003 | Blais et al. |
| 2004/0000666 A1 | 1/2004 | Lidar et al. |
| 2004/0016918 A1 | 1/2004 | Amin et al. |
| 2004/0119061 A1 | 6/2004 | Wu et al. |
| 2004/0140537 A1 | 7/2004 | Il et al. |
| 2004/0155728 A1 | 8/2004 | Cheung et al. |
| 2004/0165454 A1 | 8/2004 | Amin et al. |
| 2004/0170047 A1 | 9/2004 | Amin et al. |
| 2004/0239319 A1 | 12/2004 | Tralshawala et al. |
| 2005/0082519 A1 | 4/2005 | Amin et al. |
| 2005/0184284 A1 | 8/2005 | Burkard et al. |
| 2005/0224784 A1 | 10/2005 | Amin et al. |
| 2005/0250651 A1 | 11/2005 | Amin et al. |
| 2005/0256007 A1 | 11/2005 | Amin et al. |
| 2006/0097746 A1 | 5/2006 | Amin |
| 2007/0096730 A1 | 5/2007 | Meyer et al. |
| 2007/0241747 A1 | 10/2007 | Morley et al. |
| 2008/0176750 A1 | 7/2008 | Rose et al. |
| 2009/0070402 A1 | 3/2009 | Rose et al. |
| 2009/0078931 A1 | 3/2009 | Berkley |
| 2009/0082209 A1 | 3/2009 | Bunyk et al. |
| 2009/0121215 A1 | 5/2009 | Choi |
| 2009/0122508 A1 | 5/2009 | Uchaykin et al. |
| 2009/0168286 A1 | 7/2009 | Berkley et al. |
| 2009/0206871 A1 | 8/2009 | Baumgardner et al. |
| 2009/0289638 A1 | 11/2009 | Farinelli et al. |
| 2009/0319757 A1 | 12/2009 | Berkley |
| 2010/0097056 A1 | 4/2010 | Lam et al. |
| 2011/0031462 A1 | 2/2011 | Jedema et al. |
| 2011/0060780 A1 | 3/2011 | Berkley et al. |
| 2011/0089405 A1 | 4/2011 | Ladizinsky et al. |
| 2012/0023053 A1 | 1/2012 | Harris et al. |
| 2012/0094838 A1 | 4/2012 | Bunyk et al. |
| 2012/0098594 A1 | 4/2012 | Zmuidzinas et al. |
| 2012/0159272 A1 | 6/2012 | Pesetski et al. |
| 2013/0278283 A1 | 10/2013 | Berkley |
| 2014/0223224 A1 | 8/2014 | Berkley |
| 2014/0229722 A1 | 8/2014 | Harris |
| 2015/0032993 A1 | 1/2015 | Amin et al. |

(56) References Cited

U.S. PATENT DOCUMENTS

| | | | |
|---|---|---|---|
| 2015/0032994 | A1 | 1/2015 | Chudak et al. |
| 2015/0111754 | A1 | 4/2015 | Harris et al. |
| 2015/0119252 | A1 | 4/2015 | Ladizinsky et al. |
| 2016/0079968 | A1 | 3/2016 | Strand et al. |
| 2016/0112031 | A1 | 4/2016 | Abraham et al. |
| 2016/0125309 | A1 | 5/2016 | Naaman et al. |
| 2016/0233860 | A1 | 8/2016 | Naaman |
| 2016/0364653 | A1 | 12/2016 | Chow et al. |
| 2017/0085231 | A1 | 3/2017 | Abdo |
| 2017/0178018 | A1 | 6/2017 | Tcaciuc et al. |
| 2017/0344898 | A1 | 11/2017 | Karimi et al. |
| 2018/0145631 | A1 | 5/2018 | Berkley et al. |
| 2018/0218279 | A1 | 8/2018 | Lechner et al. |
| 2018/0330267 | A1 | 11/2018 | Rigetti et al. |
| 2018/0337322 | A1 | 11/2018 | Brink et al. |
| 2019/0019098 | A1 | 1/2019 | Przybysz |
| 2019/0019099 | A1 | 1/2019 | Hoskinson et al. |
| 2020/0342959 | A1 | 10/2020 | Tavernelli et al. |
| 2021/0248506 | A1 | 8/2021 | Hoskinson et al. |
| 2021/0265964 | A1 | 8/2021 | Miano et al. |
| 2022/0207404 | A1 | 6/2022 | Boothby |

FOREIGN PATENT DOCUMENTS

| | | | |
|---|---|---|---|
| JP | 2016515233 | A | 5/2016 |
| JP | 2018500784 | A | 1/2018 |
| SU | 539333 | A1 | 12/1976 |
| WO | 0227653 | A2 | 4/2002 |
| WO | 2005093649 | A1 | 10/2005 |
| WO | 2005109565 | A1 | 11/2005 |
| WO | 2007085074 | A1 | 8/2007 |
| WO | 2008022410 | A1 | 2/2008 |
| WO | 2009099972 | A2 | 8/2009 |
| WO | 2009120638 | A2 | 10/2009 |
| WO | 2010042735 | A2 | 4/2010 |
| WO | 2012155329 | A1 | 11/2012 |
| WO | 2014123980 | A1 | 8/2014 |
| WO | 2014135749 | A1 | 9/2014 |
| WO | 2016127021 | A1 | 8/2016 |
| WO | 2016183213 | A1 | 11/2016 |
| WO | 2017192733 | A2 | 11/2017 |
| WO | 2018111242 | A1 | 6/2018 |
| WO | 2020188269 | A1 | 9/2020 |
| WO | 2023091936 | A1 | 5/2023 |
| WO | 2023107955 | A1 | 6/2023 |

OTHER PUBLICATIONS

Heinsoo, J. et al., "Rapid high-fidelity multiplexed readout of superconducting qubits," arXiv:1801.07904v1 [quant-ph], Jan. 24, 2018, 13 pages.
International Search Report and Written Opinion for PCT/US2022/079944 dated Mar. 13, 2023, 10 pages.
Po-Yu Kuo et al., 'A Novel Cross-Latch Shift Register Scheme for Low Power Applications', Applied Sciences, vol. 11, Dec. 2020, p. 2; and figure 5.
Aaronson, "Thanksgiving Special: D-Wave at MIT," Shtetl-Optimized—The Blog of Scott Aaronson, URL=http://www.scottaaronson.com/blog/?p=291, retrieved Apr. 14, 2011 (originally retrieved Nov. 28, 2007), 54 pages.
B. H. Eom et al., "Wideband, Low-Noise Superconducting Amplifier with High Dynamic Range", arXiv:1201.2392v1 [cond-mat.supr-con], 2012, 23 pages.
Barenco et al., "Elementary gates for quantum computation," Physical Review A 52(5):3457-3467, Nov. 1995.
Barends R. et al., "Coherent Josephson qubit suitable for scalable quantum integrated circuits," arXiv:1304.2322v1 [quant-ph], Apr. 8, 2013, 10 pages.
Bell et al., "Traveling Wave Parametric Amplifier based on a chain of Coupled Asymmetric SQUIDs", arXiv:1509.04573 [cond-mat.supr-con], Sep. 15, 2015.
Berkley, "Methods of Ferromagnetic and Adiabatic Classical Qubit State Copying," U.S. Appl. No. 60/675,139, filed Apr. 26, 2005, 63 pages.
Bertet et al., "Dephasing of a Superconducitng Qubit Nduced by Photon Noise", Physical Review Letters 95, Dec. 13, 2005.
Blais et al., Cavity Quantum Electrodynamics for Superconducting Electrical Circuits: An Architecture for Quantum Computation, Physical Review A 69(062320):1-14, 2004.
Blais et al., "Tunable Coupling of Superconducting Qubits," Physical Review Letters 90(12):127901-1-127901-4, Mar. 28, 2003.
Blatter et al., "Design aspects of superconducting-phase quantum bits," Physical Review B 63: 174511-1-174511-9, 2001.
Berkley , et al., "A scalable readout system for a superconducting adiabatic quantum optimization system", arXiv, May 6, 2009, 18 pages.
Bronn , et al., "Reducing Spontaneous Emission in Circuit Quantum electrodynamics by a Combined Readout/Filter Technique", arXiv:1504.04353 [quant-ph], 2015, 9 pages.
Bronn, Nicholas T, et al., "Reducing Spontaneous Emission in Circuit Quantum Electrodynamics by a Combined Readout/Filter Technique," arXiv:1504.04353v1 [quant-ph], Apr. 16, 2015, 8 pages.
Casas, Juan , et al., "A Quantum Flux Parametron (QFP) 12-Bit Shift Register Capable of Stable Microwave Frequency Operation," Japanese Journal of Applied Physics vol. 30, No. 12B, Dec. 1991, pp. 3939-3942.
Chen , et al., Multiplexed dispersive readout of superconducting phase qubits, arXiv: 1209.1781v1 [cond-mat.supr-con], 2012, 4 pages.
Chen, Yu , et al., "Multiplexed dispersive readout of superconducting phase qubits," arXiv:1209.1781v1 [cond-mat, supr-con], Sep. 9, 2012, 4 pages.
Colless, J. I, et al., "Cryogenic High-Frequency Readout and Control Platform for Spin Qubits," arXiv:1111.6440v2 [cond-mat.mes-hall], Nov. 29, 2011, 8 pages.
Day, Peter K, et al., "A broadband superconducting detector suitable for use in large arrays," Letters to Nature, Nature, vol. 425, Oct. 23, 2003, pp. 817-821.
DiCarlo, L. , et al., "Preparation and Measurement of Three-Qubit Entanglement in a Superconducting Circuit," arXiv:1004.4324v1 [cond-mat.mes-hall,] Apr. 25, 2010, 9 pages.
Hornibrook, J. M, et al., "Frequency multiplexing for readout of spin qubits," Applied Physics Letters 104, 103108, 2014, 4 pages.
Jeffrey , et al., "Fast Scalable State Measurement with Superconducting Qubits", arXiv:1401.0257v3 [quant-ph], 2014, 9 pages.
Jerger , et al., "Frequency division multiplexing readout and simultaneous manipulation of an array of flux qubits", arXiv:1205.6375v2 [quant-ph], 2012, 4 pages.
Jerger, M., et al., "Frequency division multiplexing readout and simultaneous manipulation of an array of flux qubits," Applied Physics Letter 101, 042604 (2012), 5 pages.
Jerger , et al., "Spectroscopy of a Qubit Array via a Single Transmission Line", arXiv:1205.6375v2 [quant-ph], 2011, 3 pages.
Jerger, M. , et al., "Spectroscopy of a Qubit Array via a Single Transmission Line," arXiv:1102.0404v1 [cond-mat.supr-con], Feb. 2, 2011, 3 pages.
Krantz , et al., "Single-shot Readout of a Superconducting Qubit using a Josephson Parametric Oscillator"; arXiv:1508.02886v2 [quant-ph], 2016, 11 pages.
Majer, J. , et al., "Coupling Superconducting Qubits via a Cavity Bus," arXiv:0709.2135v1 [cond-mat.mes-hall], Sep. 13, 2007, 6 pages.
Manzin, Benjamin A, et al., "Digital readouts for large microwave low-temperature detector arrays," Nuclear Instruments and Methods in Physics Research, Section A, 2006, 3 pages.
McClure , et al., "Rapid Driven Reset of a Qubit Readout Resonator", arXiv:1503.01456v2 [quant-ph]. 2015, 5 pages.
McClure, D. T, et al., "Rapid Driven Reset of a Qubit Readout Resonator," arXiv:1503.01456v1 [quant-ph], Mar. 4, 2015, 5 pages.
McKenney , et al., "Design considerations for a background limited 350 micron pixel array using lumped element superconducting microresonators" , SPIE, Sep. 24, 2012, 10 pages.

(56) References Cited

OTHER PUBLICATIONS

Michotte, S., "Qubit dispersive readout scheme with a microstrip squid amplifier," arXiv:0812.0220v1 [cond-mat.supr-con], Dec. 1, 2008, 4 pages.
Monfardini, A., et al., "Nika: A millimeter-wave kinetic inductance camera," Astronomy & Astrophysics, 521, A29 2010, 6 pages.
Palacios-Laloy, A., et al., "Tunable resonators for quantum circuits," arXiv:0712.0221v1 [quant-ph] Dec. 3, 2007, 8 pages.
Palacios-Laloy, A., et al., "Tunable Resonators for Quantum Circuits," J Low Temp Phys (2008) 151: 1034-1042.
Robertson, T. L, et al., "Superconducting quantum interference device with frequency-dependent damping: Readout of flux qubits," Physical Review B 72, 024513 (2005), 9 pages.
Sank, et al., "Measurement-Induced State Transitions in a Superconducting Qubit: Beyond the Rotating Wave Approximation", arXiv:1606.05721v2 [quant-ph], 2016, 10 pages.
Semenov, et al., "Classical and Quantum Operation Modes of the Reversible Logic Circuits," Department of Physics and Astronomy, Stony Brook University, Stony Brook, New York, Presentation, Dec. 2006, 29 pages.
Swenson, et al., "MAKO: A pathfinder instrument for on-sky demonstration of low-cost 350 micron imaging arrays", arXiv:1211.0315v1 [astro-ph.IM], 2012, 10 pages.
Swenson, Loren J, et al., "MAKO: A pathfinder instrument for on-sky demonstration of low-cost 350 micron imaging arrays," arXiv:1211.0315v1 [astro-ph.IM] Nov. 1, 2012, 10 pages.
Volkmann, et al., "Low-dissipation multiplexed flux-sensitive readout in superconducting circuits", 2015 15th International Superconductive Electronics Conference (ISEC), 2015, 3 pages.
Wang, Z. L, et al., "Quantum state characterization of a fast tunable superconducting resonator," Applied Physics Letters 102, 163503 (2013), 4 pages.
Whittaker, et al., "Tunable-cavity QED with phase qubits", Physical Review, B 90, 024513, 2014, 15 pages.
Yates, S. J. C, et al., "Faster Fourier transform spectrometer readout for large arrays of microwave kinetic inductance detectors," University of Groningen, Applied Physics Letters, 2009, 5 pages.
First Office Action—JP Application No. 2020-544663, dated Mar. 22, 2023, 13 pages.
Christopher Eichler et al., 'Controlling the dynamic range of a Josephson parametric amplifier', EPJ Quantum Technology, vol. 1, No. 2, Jan. 29, 2014.
International Search Report and Written Opinion, mailed Apr. 18, 2023, for PCT/US2022/081029, 12 pages.
Japanese Office Action for JP 2021-513362, mailed Apr. 13, 2023, 7 pages (with English Translation).
M. A. Castellanos-Beltran et al., 'A widely tunable parametric amplifier based on a SQUID array resonator', arXiv:0706.2373v1, Jun. 2007.
M. Hatridge et al., 'Dispersive magnetometry with a quantum limited SQUID parametric amplifier', arXiv:1003.2466v2, Dec. 2010.
T.C. White et al., 'Traveling wave parametric amplifier with Josephson junctions using minimal resonator phase matching', arXiv:1503.04364v1, Mar. 2015.
Vollmer, R., "Fast and scalable readout for fault-tolerant quantum computing with superconducting Qubits," Master's Thesis, QuTech, Department of Quantum Nanoscience, Delft University of Technology, Jul. 10, 2018, 80 pages.
Chinese Office Action, mailed Nov. 13, 2023, for Application No. 2019800212792, 70 pages. (with English Translation).
Ex Parte Quayle Issued in U.S. Appl. No. 17/158,484, mailed Jan. 19, 2024, 9 pages.
Abdo, t al., "Multi-Path Interferometric Josephson Directional Amplifier for Qubit Readout" arXiv:1710.02521v1 [physics.ins-det] Oct. 8, 2017, 17 pages.
Adbo, et al., "Active protection of a superconducting qubit with an interferometric Josephson isolator", arXiv:1810.07234v1 [quant-ph] Oct. 16, 2018, 19 pages.
Banys, et al., "Millimetre Wave Kinetic Inductance Parametric Amplification using Ridge Gap Waveguide" arXiv:2111.06416v1 [cond-mat.supr-con] Nov. 11, 2021, 9 pages.
Beltran, "Development of a Josephson Parametric Amplifier for the Preparation and Detection of Nonclassical States of Microwave Fields" by Manuel Angel Castellanos Beltran B.S., Tecnol'ogico de Monterrey, 2002, Thesis, 300 pages.
Bergeal, et al., Phase-preserving amplification near the quantum limit with a Josephson ring modulator, nature Letters, vol. 465| May 6, 2010| doi:10.1038/nature09035, 6 pages.
Castellanos, et al., "Amplification and squeezing of quantum noise with a tunable Josephson metamaterial", Letters, nature physics vol. Dec. 4, 2008 www.nature.com/naturephysics, 4 pages.
Chaudhuri, et al., "Broadband parametric amplifiers based on nonlinear kinetic inductance artificial transmission lines", arXiv:1704.00859v1 [quant-ph] Apr. 4, 2017.
Farhi et al., "A quantum adiabatic evolution algorithm applied to random instances of an NP-Complete problem", Science, vol. 292, Apr. 20, 2001.
Krantz et al., "A quantum engineer's guide to superconducting qubits", Appl. Phys. Rev. 6, 021318 (2019), Jun. 20, 2019.
Macklin, "Quantum Feedback and Traveling-wave Parametric Amplification in Superconducting Circuits", https://escholarship.org/uc/item/41d554w, 2015, 152 pages.
Macklin, et al., "A near-quantum-limited Josephson traveling-wave parametric amplifier", Science Sciencemag.org,, Oct. 16, 2015 vol. 350, Issue 6258, 5 pages.
Macklin, et al., "Supplementary Materials for A near-quantum-limited Josephson traveling-wave parametric amplifier", Published Sep. 3, 2015 on Science Express DOI: 10.1126/science.aaa8525, 17 pages.
Malnou, et al., "Performance of a Kinetic-Inductance Traveling-Wave Parametric Amplifier at 4 Kelvin: Toward an Alternative to Semiconductor Amplifiers", arXiv:2110.08142v1 [quant-ph] Oct. 15, 2021, 11 pages.
Mutus, et al., "Design and characterization of a lumped element single-ended superconducting microwave parametric amplifier with on-chip flux bias", arXiv:1308.1376v3 [cond-mat.supr-con] Oct. 3, 2013, 5 pages.
Naaman, et al., "High Saturation Power Josephson Parametric Amplifier with GHz Bandwidth", arXiv:1711.07549v1 [physics.ins-det] Oct. 31, 2017, 5 pages.
Naaman, et al., "Josephson junction microwave modulators for qubit control", arXiv:1610.07987v2 [cond-mat.supr-con] Feb. 22, 2017, 18 pages.
Non-Final Office Action Issued in U.S. Appl. No. 17/054,284, mailed Sep. 13, 2023, 10 pages.
O'Brien, et al., "Resonant Phase Matching of Josephson Junction Traveling Wave Parametric Amplifiers", Physical Review Letters, PRL 113, 157001, Oct. 10, 2014, 5 pages.
Parker, et al., "A near-ideal degenerate parametric amplifier", arXiv:2108.10471v2 [quant-ph] Aug. 26, 2021, 39 pages.
Planat, "Resonant and traveling-wave parametric amplificon near the quantum limit", Quantum coherence team Néel Insitute, Grenoble, 2020, 237 pages.
QrigJosephson Parametric Amplifiers: Theory and Application, Workshop on Microwave Cavity Design for Axion Detection Livermore Valley Open Campus Aug. 25-27, 2015, 56 pages.
Ribeill, "Qubit Readout with the Josephson Photomultiplier", Doctor of Philosophy, ProQuest No. 10077441, 2016, 200 pages.
Sivak, et al. "Josephson Array Mode Parametric Amplifier", arXiv:1909.08005v1 [quant-ph] Sep. 17, 2019, 14 pages.
Slichter, "Quantum Jumps and Measurement Backaction in a Superconducting Qubit", Doctor of Philosophy in Physics, 2011, 216 pages.
Spietz, et al., "Input impedance and gain of a gigahertz amplifier using a dc superconducting quantum interference device in a quarter wave resonator", Applied Physics Letters, 93, 082506 (2008); doi: 10.1063/1.2970967, 4 pages.
Spietz, et al., "Superconducting quantum interference device amplifiers with over 27 GHz of gain-bandwidth product operated in the 4-8 GHz frequency range", Appl. Phys. Lett. 95, 092505 (2009); doi: 10.1063/1.3220061, 4 pages.

(56) References Cited

OTHER PUBLICATIONS

Spiez, et al., "Noise performance of lumped element direct current superconducting quantum interference device amplifiers in the 4-8 GHz range", Appl. Phys. Lett. 97, 142502 (2010); doi: 10.1063/1.3497008, 4 pages.
Thorbeck, et al., "Reverse Isolation and Backaction of the SLUG Microwave Amplifier", Physical Review Applied 8, 054007 (2017), 6 pages.
Vijay, et al., "Observation of quantum jumps in a superconducting artificial atom", arXiv:1009.2969v3 [cond-mat.mes-hall] Feb. 25, 2011, 8 pages.
White, "Preserving entanglement during weak measurement demonstrated with a violation of the Bell-Leggett-Garg inequality", Doctor of Philosophy, 2015, 191 pages.
White, "Traveling Wave Parametric Amplifier With Josephson Junctions Using Minimal Resonator Phase Matching (Supplementary Information)", 2015, 10 pages.
Winkel, et al., "Non-degenerate parametric amplifiers based on dispersion engineered Josephson junction arrays", arXiv:1909.08037v1 [quant-ph] Sep. 17, 2019, 18 pages.
Maassen van den Brink et al., "Tunable Coupling of flux qubits through a simple flux transformer".
Maassen van den Brink et al., "Analog Processor Comprising Quantum Devices," U.S. Appl. No. 60/705,503, filed Aug. 3, 2005, 71 pages.
Madou, Fundamentals of Microfabrication: The Science of Miniaturization, CRC Press, 2002, pp. 1-14.
Majer et al., "Spectroscopy on Two Coupled Superconducting Flux Qubits," Physical Review Letters 94:090501-1-090501-4, 2005.
Makhlin et al., "Quantum-state engineering with Josephson-junction devices," Reviews of Modern Physics 73 (2):357-400, Apr. 2001.
Martinis et al., "Rabi Oscillations in a Large Josephson-Junction Qubit," Physical Review Letters 89(11):117901-1-117901-4, Sep. 9, 2002.
Mooij et al., "Josephson Persistent-Current Qubit," Science 285:1036-1039, Aug. 13, 1999.
Murray et al., "Coupling Methods and Architectures for Information Processing," U.S. Appl. No. 11/247,857, filed Oct. 10, 2005, 73 pages.
Murray et al., "Coupling Schemes for Information Processing," U.S. Appl. No. 60/460,420, filed Dec. 30, 2004, 44 pages.
Nakamura et al., "Coherent control of macroscopic quantum states in a single-Cooper-pair-box," Nature 398:786-788, Apr. 29, 1999.
Nielsen et al., Quantum Computation and Quantum Information, Cambridge University Press, Cambridge, 2000, "7.8 Other implementation schemes," pp. 343-345.
Niskanen et al., "Quantum Coherent Tunable Coupling of Superconducting Qubits," Science 316:723-726, May 4, 2007.
Non-Final Office Action Issued in U.S. Appl. No. 16/975,646 Mailed Dec. 20, 2021, 24 pages.
Oppenländer et al., "Non--periodic Macroscopic Quantum Interference in One-Dimensional Parallel Josephson Junction Arrays With Unconventional Grating Structure" Physical Review B 63, Dec. 20, 2000.
Orlando et al., "Superconducting persistent-current qubit," Physical Review B 60(22):15398-15413, Dec. 1, 1999.
Ortlepp et al., "Access Time and Power Dissipation of a Model 256-Bit Single Flux Quantum Ram", IEEE Transactions on Applied Superconductivity, Sep. 2014.
Ortlepp et al., "Design guidelines for Suzuki stacks as reliable high-speed Josephson voltage drivers", Supercond. Sci. Technol., Jan. 21, 2013.
Paternosto et al., "Quantum-state transfer in imperfect artificial spin networks", Physical Review A 71, Jul. 7, 2004.
Petersan et al., "Measurement of resonant frequency and quality factor of microwave resonators: Comparison of methods," Journal of Applied Physics, vol. 84, No. 6, Sep. 15, 1998, 11 pages.
Planat et al., "A photonic crystal Josephson traveling wave parametric amplifier", Physical Review X, Apr. 28, 2020.

Plourde et al., "Entangling Flux Qubits with a Bipolar Dynamic Inductance," Physical Review B 70, arXiv:quant-ph/0406049v1, Jun. 8, 2004, 4 pages.
Pobell, "The 3He-4He Dilution Refrigerator", Springer-Verlag Berlin Heidelberg, Jun. 18, 1905.
Ramos et al., "Design for Effective Thermalization of Junctions for Quantum Coherence," IEEE Transactions on Applied Superconductivity 11(1):998-1001, Mar. 2001.
Rose, "Analog Processor With Quantum Devices," U.S. Appl. No. 60/638,600, filed Dec. 23, 2004, 42 pages.
Shnirman et al., "Quantum Manipulations of Small Josephson Junctions," Physical Review Letters 79(12): 2371-2374, Sep. 22, 1997.
Shor, "Introduction to Quantum Algorithms," AT&T Labs—Research, arXiv:quant-ph/0005003 v2, pp. 1-17, Jul. 6, 2001.
Strauch, Theory of Superconducting Phase Qubits, UMI Microform, Ann Arbor, Michigan, 2005, Chapter 8, "Conclusion," pp. 298-306.
Swenson et al., "Operation of a titanium nitride superconducting microresonator detector in the nonlinear regime," arXiv:1305.4281v1 [cond-mat.supr-con], May 18, 2013, 11 pages.
Tavares, "New Algorithms for Quadratic Unconstrained Binary Optimization (Qubo) With Applications in Engineering and Social Sciences", dissertation, Rutgers, May 1, 2008.
Tian, et al; "Projective Measurement Scheme for Solid-State Qubits"; arXiv:quant-ph/0310083v1; Oct. 13, 2021; 12 pages.
Van Dam, "Quantum Computing: In the 'Death Zone'?," Nature Physics 3:220-221, Apr. 2007.
Van den Brink et al., "Analog Processor Comprising Quantum Devices," Amendment filed Nov. 22, 2010, for U.S. Appl. No. 12/397,999, 8 pages.
Van den Brink et al., "Analog Processor Comprising Quantum Devices," Amendment filed Sep. 16, 2008, for U.S. Appl. No. 11/317,838, 11 pages.
Van den Brink et al., "Analog Processor Comprising Quantum Devices," Notice of Allowance mailed Feb. 23, 2015, for U.S. Appl. No. 14/175,731, 10 pages.
Van den Brink et al., "Analog Processor Comprising Quantum Devices," Office Action mailed Aug. 27, 2010, for U.S. Appl. No. 12/397,999, 8 pages.
Van den Brink et al., "Analog Processor Comprising Quantum Devices," Preliminary Amendment filed Apr. 24, 2014, for U.S. Appl. No. 14/175,731, 9 pages.
Van Zant, "Microchip Fabrication", Fourth Edition, McGraw-Hill, New York, 2000. (book details provided).
Venugopal et al., "Dynamic Blocking and Collapsing for Gibbs Sampling", arXiv:1309.6870 [cs.AI], Sep. 1, 1993.
Volkmann, "Distributed resonator design for for Fortuna", Sep. 22, 2016.
Wang et al., "Fast Entanglement of Two Charge-Phase Qubits Through Nonadiabatic Couling to a Large Josephson Junction," Physical Review B 70:224515-1-224515-4, 2004.
Wel et al., "Quantum Computation with Josephson-Qubits by Using a Current-Biased Information Bus," arXiv:cond-mat/0407667 v1, pp. 1-13, Jul. 26, 2004.
White et al., "Traveling wave parametric amplifier with Josephson junctions using minimal resonator phase matching", Applied Physics Letters 106, Jun. 15, 2015.
Wocjan et al., "Treating the Independent Set Problem by 2D Ising Interactions with Adiabatic Quantum Computing," arXiv:quant-ph/0302027v1, pp. 1-13, Feb. 4, 2003.
Written Opinion, mailed Sep. 30, 2016, for PCT/US2016/031885, 9 pages.
You et al., "Controllable Manipulation and Entanglement of Macroscopic Quantum States in Coupled Charge Qubits," Physical Review B 68:024510-1-024510-8, 2003.
Zorin et al., "Traveling-Wave Parametric Amplifier Based on Three-Wave Mixing in Josephson Metamaterial", arXiv:1705.02859 [cond-mat.supr-con], May 8, 2017.
Shulga, K.V., et al., "Magnetically induced transparency of a quantum," Nature Communications, Jan. 11, 2018, 6 pages., Jan. 11, 2018.

(56) References Cited

OTHER PUBLICATIONS

Whittaker, J.D., et al., "A frequency and sensitivity tunable microresonator array for high-speed quantum," arXiv:1509.05811v2 [quant-ph], Apr. 22, 2016, 8 pages., Apr. 22, 2016.
Bocko et al., "Prospects for Quantum Coherent Computation Using Superconducting Electronics," IEEE Transactions on Applied Superconductivity 7(2):3638-3641, Jun. 1997.
Bryant et al., "Introduction to Electronic Analogue Computing," Physics& Mathematics, AEC Research and Development Report, pp. 2-50, Aug. 1966.
Bunyk et al., "Architectural Considerations in the Design of a Superconducting Quantum Annealing Processor," IEEE Trans. Appl. Supercond., 24, arXiv:1401.5504v1 [quant-ph] Jan. 21, 2014, 9 pages.
Chang, "Parametric Microwave Amplifications using a Tunable Superconducting Resonator", University of Waterloo Thesis, Jul. 7, 1905.
Chiarello, "Quantum computing with superconducting quantum interference devices: a possible strategy", Physics Letters A, Dec. 4, 2000.
Chiorescu, et al. "Coherent Quantum Dynamics of a Superconducting Flux Qubit", Science Feb. 13, 2003, vol. 299, Issue 5614—pp. 1869-1871.
Choudhury, Handbook of Microlithography, Micromachining and Microfabrication vol. 1: Microlithography, The International Society for Optical Engineering, Bellingham, Washington, 1997.
Clarke et al., "Quiet Readout of Superconducting Flux States," Physica Scripta. T102: 173-177, 2002.
Communication Pursuant to Rule 164(1) EPC, mailed Jun. 21, 2021, for European Application No. 19760892.0, 14 pages.
Communication Pursuant to Rule 164(1) EPC, mailed Mar. 3, 2021, for European Application No. 19760892.0, 12 pages.
Cormen et al., Introduction to Algorithms, The MIT Press, Cambridge, Massachusetts, pp. 964-985, 2000.
Cosmelli et al., "Flux and phase qubits: techniques of operation".
Cosmelli, C., "Controllable Flux Coupling for the Integration of Flux Qubits," arXiv:cond-mat/0403690v1 [cond-mat.supr-con], Mar. 29, 2004, 10 pages.
Deutsch, "Quantum theory, the Church-Turing principle and the universal quantum computer," Appeared in Proceedings of the Royal Society of London A 400: 97-117, 1985.
DiVincenzo, "The Physical Implementation of Quantum Computation," Fortschr. Phys. 48:771-783, 2000.
Drisko et al., "Impedance tuning with photoconducors to 40 GHz", IET Optoelectronics, Jan. 22, 2019.
European Search Report, mailed Oct. 13, 2010, for EP 05849198.6, 10 pages.
Extended European search report for European Application No. 19799196.1, dated Feb. 18, 2022, 14 pages.
Farhi et al., "Quantum Adiabatic Evolution Algorithms versus Simulated Annealing," MIT-CTP #3228, arXiv.quant-ph/0201031 v1, pp. 1-16, Jan. 8, 2002.
Feldman et al., "Superconducting quantum computing without switches; quantum computing and quantum bits in mesoscopic systems", arXiv:quant-ph/0211158, Nov. 25, 2002.
Feynman, "Simulating Physics with Computers," International Journal of Theoretical Physics 21(6/7): 467-488, 1982.
Friedman et al., "Detection of a Schrodinger's Cat State in an rf-SQUID," arXiv:cond-mat/0004293 2:1-7, Apr. 19, 2000.
Friedman et al., "Quantum superposition of distinct macroscopic states," Nature 406:43-46, Jul. 6, 2000.
Gao, Jiansong, "The Physics of Superconducting Microwave Resonators," Thesis, In Partial Fulfillment of the Requirements for the Degree of Doctor of Philosophy, California Institute of Technology Pasadena, Califomia, May 28, 2008, 197 pages.
Garey et al., Computers and Intractability: A Guide to the Theory of NP-Completeness, W. H. Freeman and Company, New York, 1979, pp. 1-15.
Grajcar et al., "Adiabatic Quantum Evolution of Superconducting Flux Qubits," arXiv:cond-mat/0407405 v1, pp. 1-7, Jul. 15, 2004.

Han et al., "Time-Resolved Measurement of Dissipation-Induced Decoherence in a Josephson Junction," Science 293:1457-1459. Aug. 24, 2001.
Harris et al., "A Compound Josephson Junction Coupler for Flux Qubits with Minimal Crosstalk," arXiv:0904.37841 [cond-mat.supr-con] Apr. 24, 2009, 4 pages.
Harris et al., "Sign and Magnitude Tunable Coupler for Superconducting Flux Qubits," arXiv:cond-mat/0608253v1 [cond-mat.supr-con], Aug. 11, 2006, 5 pages.
Harris et al., "Experimental Demonstration of a Robust and Scalable Flux Qubit," arXiv:0909.4321v1, Sep. 24, 2009, 20 pages.
Harris et al., "Experimental Investigation of an Eight-Qubit Unit Cell in a Superconducting Optimization Processor," arXiv:1004.1628v2, Jun. 28, 2010, 16 pages.
Horsman, et al., "Surface code quantum computing by lattice surgery", 2012 Journal of Physics, 14 123011, 28 pages.
Il'ichev et al., "Continuous Monitoring of Rabi Oscillations in a Josephson Flux Qubit," Physical Review Letters 91(9):097906-1-097906-4, week ending Aug. 29, 2003.
Inokuchi et al., "Analog computation using quantum-flux parametron devices," Physica C 357-360 :1618-1621, 2001.
International Search Report and Written Opinion for PCT/US2019/018792 mailed Jun. 3, 2019, 13 pages.
International Search Report and Written Opinion for PCT/US2019/030914 mailed Sep. 4, 2019, 8 pages.
International Search Report, mailed Sep. 30, 2016, for PCT/US2016/031885, 4 pages.
Ioffe et al., "Environmentally decoupled sds—Wave Josephson junctions for quantum computing", Nature 398, pp. 679-681 (1999).
Johnson et al., "Scalable Control System for a Superconducting Adiabatic Quantum Optimization Processor," Superconductor Science & Technology (2010).
Johnson, et al; "A scalable control system for a superconducting adiabatic quantum optimization processor", Superconductor Science and Technology; IOP Publishing; Supercond. Sci. Technol. 23 (2010); vol. 23, No. 6, Jun. 1, 2010, 12 pages.
Lang, "Analog was not a Computer Trademark!," Sound & Vibration:16-24, Aug. 2000.
Lantz et al., "Josephson Junction Qubit Network with Current-Controlled Interaction," Proceedings of the Fourth International Workshop on Macroscopic Quantum Coherence and Computing (MQC2'04), Jun. 7-10, 2004, 13 pages.
Levinson, Principles of Lithography, The International Society for Optical Engineering, Bellingham, Washington, 2001.
Lidar, "On the quantum computational complexity of the Ising spin glass partition function and of knot invariants," New Journal of Physics 6(167): 1-15, 2004.
Likharev et al., "Reversible Conveyor Computaion in Array of Parametric Quantrons", IEEE Transactions on Magnetics, Mar. 1, 1985.
Likharev, "Classical and Quantum Limitations on Energy Consumption in Computation," International Journal of Theoretical Physics 21(3/4):311-326, 1982.
Likharev, "Dynamics of Some Single Flux Quantum Devices: I. Parametric Quatron," IEEE Transactions on Magnetics MAG-13(1):242-244, 1977.
Lupaşcu et al., "High-contrast dispersive readout of a superconducting flux qubit using a nonlinear resonator" arXiv:cond-mat/0601634 [cond-mat.mes-hall], Jan. 27, 2006.
Lanting, Trevor, "Development of Quantum Annealing Technology at D-Wave Systems", retrieved from https://beyondcmos.ornl.gov/documents/Session2, Nov. 29, 2017, 25 pages., Nov. 29, 2017.
Aassime, et al., "Radio-frequency single-electron transistor: Toward the shot-noise limit", Applied Physics Letters, vol. 79, No. 24 Dec. 10, 2021, 3 pages.
Blais et al., "Tunable Coupling of Superconducting Qubits," arXiv.cond-mat/0207112v3 [cond-mat.mes-hall], Mar. 18, 2003, 4 pages.
Blais, et al., "Cavity quantum electrodynamics for superconducting electrical circuits" an architecture for quantum computation, arXiv:cond-mat/0402216v1, Feb. 7, 2004, pp. 1-14 (Year:2004).

(56) References Cited

OTHER PUBLICATIONS

Cooper, et al., "Observation of quantum oscillations between a Josephson phase qubit and a microscopic resonator using fast readout", Physical Review Letters, 93(18), pp. 180401-1-180401-4, Oct. 29, 2004.
Court, et al., "Energy gap measurement of nanostructured thin aluminum films for use in single Cooper-pair devices", arXiv:0706.4150v1 [cond-mat.supr-con] Jun. 28, 2007, 9 pages.
Ilichev, et al., "Continuous Monitoring of Rabi Oscillations in a Josephson Flux Qubit", Physical Review Letters 91(9): 097906-1-097906-4, week ending Aug. 19, 2003.
Kim, et al. "Coupling of Josephson Current Qubits Using a Connecting Loop", Physical Review B 70:184525-1-184525-6, 2004.
Koch, et al., "Charge-insensitive qubit design derived from the Cooper pair box", Physical Review A 76, 042319 (2007), 19 pages.
Maasen van den Brink et al., "Mediated Tunable Coupling of Flux Qubits," arXiv:cond-mat/0501148v2, Oct. 13, 2005.
Makhlin, et al., "Quantum-state engineering with Josephson-junction devices", arXiv:cond-mat/0011269v1, Nov. 15, 2000.
Nguyen et al., "Scalable High-Performance Fluxonium Quantum Processor", arXiv:2201.09374v2 [quant-ph] Feb. 5, 2022, 29 pages.
O'Connell, et al., "Microwave Dielectric Loss at Single Photon Energies and millikelvin Temperatures", arXiv:0802.2404v1 [cond-mat.supr-con] Feb. 18, 2008, 4 pages.
Ozfidan et al., "Demonstration of Nonstoquastic Hamiltonian in Coupled Superconducting Flux Qubits," arXiv:1903.06139 Nov. 8, 2019.
Yan, et al., The flux qubit revisited to enhance coherence and reproducibility, arXiv: 1508.06299v4, Nov. 4, 2016.
You, et al., "Fast Two-Bit Operations in Inductively Coupled Flux Qubits," arXiv:cond-mat/0309491v1, pp. 1-5, Sep. 22, 2003.

SYSTEMS AND METHODS FOR COUPLING A SUPERCONDUCTING TRANSMISSION LINE TO AN ARRAY OF RESONATORS

BACKGROUND

Technical Field

This disclosure generally relates to input and/or output systems and methods for superconducting devices such as superconducting quantum computers and superconducting classical computers, and, more specifically, to systems and methods for inputting data to a superconducting quantum processor and/or measuring the state of a qubit in the superconducting quantum processor.
Frequency Multiplexed Resonant (FMR) Readout Superconducting microwave resonators have been used in a variety of fields including, but not limited to, quantum computation and astronomy. For example, in quantum computation, superconducting resonators have been used to detect the state of qubits. In astronomy, superconducting microwave resonators have been used in Microwave Kinetic Inductance Detectors (MKIDs). In both cases, many resonators (used as detectors or in detectors) can be coupled to a common transmission line and integrated through frequency domain multiplexing. Frequency domain multiplexing (FDM) is a technique in which a communication bandwidth is divided into a number of non-overlapping sub-bands, each sub-band used to carry a separate signal.

Using FMR technology, superconducting resonators of different resonant frequencies can be used for readout of multiple qubits. The resonators can share a common microwave transmission line by using frequency domain multiplexing.

BRIEF SUMMARY

Frequency Multiplexed Resonator (FMR) technology can be used to readout many single flux quanta simultaneously, and it has applications in both superconducting quantum computing and superconducting classical computing. FMR technology can also have applications in inputting data to a superconducting quantum processor, for example via a Quantum Flux Parametron (QFP) device. FMR technology can, for example, provide a scalable input/output technology.

The systems and methods described in the present application relate to aspects of FMR technology including a) the use an array of superconducting shunt-coupled resonators strongly coupled to a superconducting transmission line to perform high-speed readout, and b) approaches to at least partially compensate for transmission line impedance variations that can occur in the vicinity of the superconducting shunt-coupled resonators.

A superconducting circuit may be summarized as including a transmission line, the transmission line comprising at least one transmission line inductance; a superconducting resonator; a coupling capacitance that communicatively couples the superconducting resonator to the transmission line. The superconducting resonator may include a shunt capacitance coupled between the transmission line and a first node via a superconductive path; a resonator inductance coupled between the transmission line and the first node via a superconductive path, the resonator inductance in parallel with the shunt capacitance of the superconducting resonator; a first DC superconducting quantum interference device (SQUID) coupled between the resonator inductance and the first node via a superconductive path, in parallel with the shunt capacitance of the superconducting resonator and in series with the resonator inductance of the superconducting resonator; and a second DC superconducting quantum interference device (SQUID) coupled between the first DC SQUID and the first node via a superconductive path, in parallel with the shunt capacitance of the superconducting resonator and in series with the resonator inductance of the superconducting resonator and in series with the first DC SQUID of the superconducting resonator.

The superconducting circuit may further include a first interface operable to apply a first flux bias to the first DC SQUID, and a second interface operable to apply a second flux bias to the second DC SQUID. The value of the shunt capacitance may be selected to be at least one order of magnitude larger than the value of the coupling capacitance. The first node may be electrically coupled to ground via a superconductive path. The value of the at least one transmission line inductance may be selected to at least partially compensate for a variation in coupling strength between the superconducting resonator and the transmission line. The at least one transmission line inductance may include a first inductance upstream of the superconducting resonator; and a second inductance downstream of the superconducting resonator. The transmission line may include a center line that includes the first and the second inductance. At least one of the first and the second inductance may be a lumped-element inductance. At least one of the first and the second inductance may be a kinetic inductance. The value of at least one of the first and the second inductance may be selected to at least partially compensate for a variation in coupling strength between the superconducting resonator and the transmission line.

The transmission line may include a center line that includes the transmission line inductance. The transmission line inductance may be a lumped-element inductance. The transmission line inductance may be a kinetic inductance. The superconducting resonator may be strongly-coupled to the transmission line. The transmission line may be a coaxial transmission line. The transmission line may be a coplanar waveguide. The superconducting circuit may be operable to readout data from a quantum device. The superconducting circuit may be operable to load data into a quantum device. The transmission line inductance may be proximate the superconducting resonator.

The superconducting circuit may further include a shift register stage; and an interface operable to apply a flux bias to the shift register stage. The superconducting resonator may be one of a plurality of superconducting resonators in an array of superconducting resonators, each of the plurality of superconducting resonators coupled to the transmission line. The transmission line may be a microwave transmission line, and the superconducting resonator is a microwave superconducting resonator.

A method of assembly of a superconducting circuit may be summarized as including providing a transmission line having a length; providing a superconducting resonator; communicatively coupling the superconducting resonator to the transmission line via a coupling capacitance; and introducing at least one transmission line inductance into the transmission line, a value of the at least one transmission line inductance selected to at least partially compensate for a variation in a characteristic impedance of the transmission line, the variation caused at least in part by the coupling capacitance.

Providing a superconducting resonator may include providing a shunt capacitance coupled between the transmission line and a first node via a superconductive path; providing a resonator inductance coupled between the transmission line and the first node via a superconductive path, the resonator inductance in parallel with the shunt capacitance of the superconducting resonator; providing a first DC superconducting quantum interference device (SQUID) coupled between the resonator inductance and the first node via a superconductive path, in parallel with the shunt capacitance of the superconducting resonator and in series with the resonator inductance of the superconducting resonator; and providing a second DC superconducting quantum interference device (SQUID) coupled between the first DC SQUID and the first node via a superconductive path, in parallel with the shunt capacitance of the superconducting resonator and in series with the resonator inductance of the superconducting resonator and in series with the first DC SQUID of the superconducting resonator. Providing a shunt capacitance may include selecting the value of the shunt capacitance to be at least one order of magnitude larger than the value of the coupling capacitance. Providing a shunt capacitance coupled between the transmission line and a first node via a superconductive path may include electrically coupling the first node to ground via a superconductive path.

Introducing at least one transmission line inductance into the transmission line may include selecting the value of the at least one transmission line inductance to at least partially compensate for a variation in coupling strength between the superconducting resonator and the transmission line. Introducing at least one transmission line inductance may include introducing a first inductance upstream of the superconducting resonator; and introducing a second inductance downstream of the superconducting resonator. Providing a transmission line having a length may include providing a transmission line comprising a center line that includes the first and the second inductance. Introducing at least one of the first and the second inductance may include introducing a lumped-element inductance. Introducing at least one of the first and the second inductance may include introducing a kinetic inductance. Introducing at least one of the first and the second inductance may include selecting a value of at least one of the first and the second inductance to at least partially compensate for a variation in coupling strength between the superconducting resonator and the transmission line. Providing a transmission line having a length may include providing a transmission line comprising a center line that includes the transmission line inductance. Introducing at least one transmission line inductance into the transmission line may include introducing a lumped-element inductance. Introducing at least one transmission line inductance into the transmission line may include introducing a kinetic inductance. Communicatively coupling the superconducting resonator to the transmission line via a coupling capacitance may include providing a strong communicative coupling between the superconducting resonator and the transmission line via the coupling capacitance. Providing a transmission line having a length may include providing a coaxial transmission line. Providing a transmission line having a length may include providing a coplanar waveguide.

The method may further include communicatively coupling the superconducting circuit to a quantum device, the superconducting circuit operable to read out data from the quantum device.

The method may further include communicatively coupling the superconducting circuit to a quantum device, the superconducting circuit operable to load data into the quantum device.

Introducing at least one transmission line inductance may include introducing at least one transmission line inductance proximate the superconducting resonator.

Providing a superconducting resonator may further include providing a first interface operable to apply a first flux bias to the first DC SQUID, and a second interface operable to apply a second flux bias to the second DC SQUID.

The method may further include providing a shift register stage; and providing an interface operable to apply a flux bias to the shift register stage. Providing a superconducting resonator may include providing one of a plurality of superconducting resonators in an array of superconducting resonators, each of the plurality of superconducting resonators coupled to the transmission line. Providing a transmission line having a length may include providing a microwave transmission line, and providing a superconducting resonator includes providing a microwave superconducting resonator.

A method of assembly of a superconducting circuit may be summarized as including providing a transmission line having a length; providing a superconducting resonator; and communicatively coupling the superconducting resonator to the transmission line via a coupling capacitance, wherein communicatively coupling the superconducting resonator to the transmission line via a coupling capacitance includes distributing the coupling capacitance along the length of the transmission line. Distributing the coupling capacitance along the length of the transmission line may include distributing the coupling capacitance to at least reduce a measure of the coupling capacitance per unit length. Distributing the coupling capacitance along the length of the transmission line may include distributing the coupling capacitance to at least reduce a variation in a characteristic impedance of the transmission line, the variation caused at least in part by the coupling capacitance. Communicatively coupling the superconducting resonator to the transmission line via a coupling capacitance may include providing a strong communicative coupling between the superconducting resonator and the transmission line via the coupling capacitance.

Providing a superconducting resonator may include providing a shunt capacitance coupled between the transmission line and a first node via a superconductive path; providing a resonator inductance coupled between the transmission line and the first node via a superconductive path, the resonator inductance in parallel with the shunt capacitance of the superconducting resonator; providing a first DC superconducting quantum interference device (SQUID) coupled between the resonator inductance and the first node via a superconductive path, in parallel with the shunt capacitance of the superconducting resonator and in series with the resonator inductance of the superconducting resonator; and providing a second DC superconducting quantum interference device (SQUID) coupled between the first DC SQUID and the first node via a superconductive path, in parallel with the shunt capacitance of the superconducting resonator and in series with the resonator inductance of the superconducting resonator and in series with the first DC SQUID of the superconducting resonator. Providing a shunt capacitance may include selecting the value of the shunt capacitance to be at least one order of magnitude larger than the value of the coupling capacitance. Providing a transmission line having a length may include providing a coaxial transmission line. Providing a transmission line having a length may include providing a coplanar waveguide.

The method may further include communicatively coupling the superconducting circuit to a quantum device, the superconducting circuit operable to read out data from the quantum device.

The method may further include communicatively coupling the superconducting circuit to a quantum device, the superconducting circuit operable to load data into the quantum device.

A superconducting circuit may be summarized as including a transmission line, the transmission line comprising at least one transmission line capacitance; a superconducting resonator; a coupling inductance that inductively communicatively couples the superconducting resonator to the transmission line.

The superconducting resonator may include a loop of superconducting material comprising; a first resonator inductance coupled between the transmission line and a first DC superconducting quantum interference device (SQUID); a second DC superconducting quantum interference device (SQUID) coupled between the first DC SQUID and a resonator capacitance; and a second resonator inductance coupled between the resonator capacitance and the transmission line.

The superconducting circuit may further include a first interface operable to apply a first flux bias to the first DC SQUID, and a second interface operable to apply a second flux bias to the second DC SQUID. The value of the at least one transmission line capacitance may be selected to at least partially compensate for a variation in coupling strength between the superconducting resonator and the transmission line. The at least one transmission line capacitance may include a first capacitance upstream of the superconducting resonator; and a second capacitance downstream of the superconducting resonator. The value of at least one of the first and the second capacitance may be selected to at least partially compensate for a variation in coupling strength between the superconducting resonator and the transmission line. The coupling inductance that inductively communicatively couples the superconducting resonator to the transmission line may be a kinetic inductance. The superconducting resonator may be strongly-coupled to the transmission line. The transmission line may be a coaxial transmission line. The transmission line may be a coplanar waveguide. The superconducting circuit may be operable to readout data from a quantum device. The superconducting circuit may be operable to load data into a quantum device. The transmission line capacitance may be proximate the superconducting resonator.

The superconducting circuit may further include a shift register stage; and an interface operable to apply a flux bias to the shift register stage. The superconducting resonator may be one of a plurality of superconducting resonators in an array of superconducting resonators, each of the plurality of superconducting resonators coupled to the transmission line. The transmission line may be a microwave transmission line, and the superconducting resonator is a microwave superconducting resonator.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn, are not necessarily intended to convey any information regarding the actual shape of the particular elements, and have been solely selected for ease of recognition in the drawings.

DETAILED DESCRIPTION

Glossary

Figure 1A:
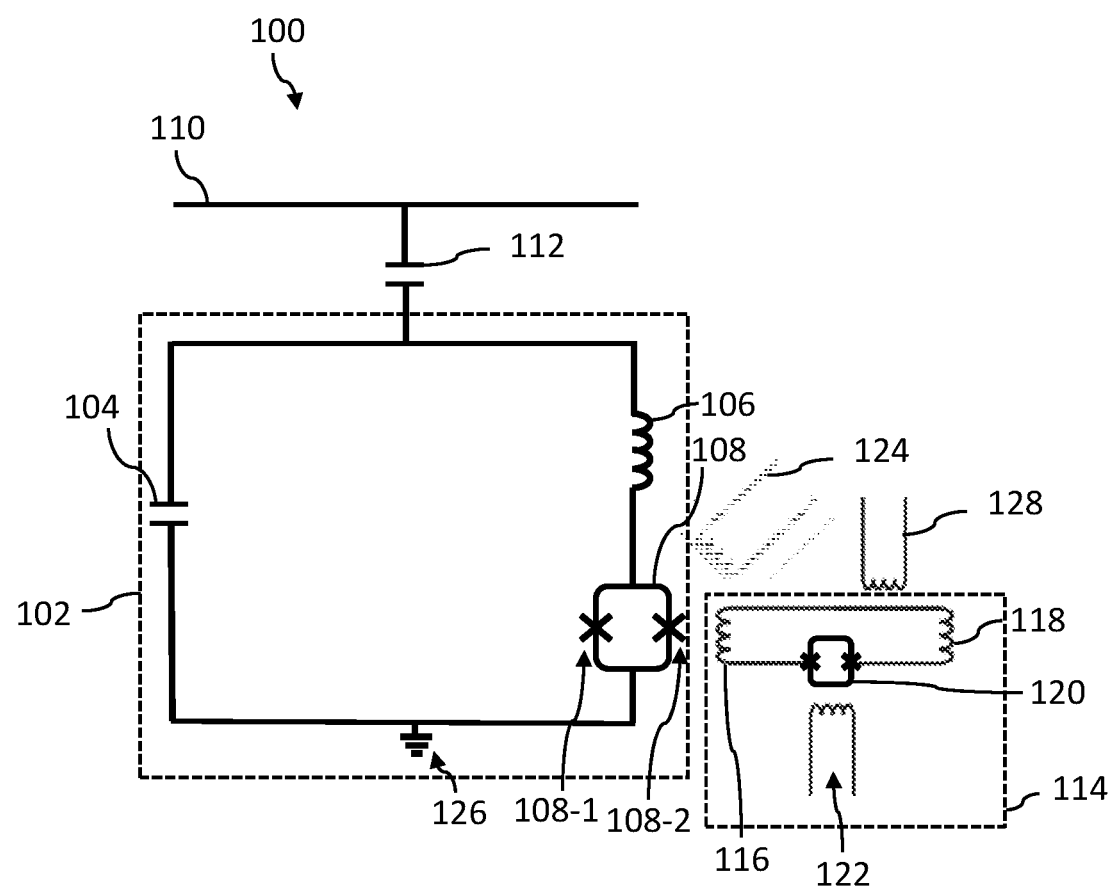
FIG. 1A is a schematic diagram illustrating an example embodiment of a superconducting circuit comprising a superconducting resonator able to tune a resonator frequency.

Qubit: A qubit (also referred to in the present application as a quantum bit) is a basic unit of quantum information, and is a quantum version of a classical binary bit that can be physically realized with a two-state device. A qubit is a two-state quantum-mechanical system. A qubit also refers to the actual physical device in which information is stored. For example, superconducting qubits are a type of superconducting device that can be included in a superconducting integrated circuit. Superconducting qubits can, for example, take the form of charged based or flux based qubits.

Superconducting device: A superconducting device is an electronic device that makes use of the properties of a superconducting material, for example zero electrical resistance and expulsion of magnetic flux when cooled below a critical temperature characteristic of the superconducting material.

Microwave transmission line: A microwave transmission line is a cable or other structure that includes one or more conductors operable to carry alternating electrical current of microwave frequency.

SQUID (Superconducting Quantum Interference Device): A SQUID is a superconducting device that includes a superconducting loop containing one or more Josephson junctions. A SQUID can be used as a magnetometer able to measure very low magnetic fields. A DC SQUID has two Josephson junctions connected in parallel. An rf-SQUID has a superconducting loop containing a single Josephson junction.

Lumped Element Design: In a lumped element design, a spatially distributed physical system is described as a topology of discrete entities that approximate the behavior of the distributed system under certain assumptions. It is useful in electrical and electronic systems, for example.

Shift Register: A shift register is a sequential logic circuit operable to store and/or transfer data.

Quantum Flux Parametron (QFP): A QFP is a logic circuit that includes at least one superconducting Josephson junction and a resonant circuit in which an oscillation can be made to represent a binary digit. Though its design makes use of quantum principles, a QFP is an element of classical computing technology rather than quantum computing technology.

Hybrid Computer: A hybrid computer is a system that includes at least one digital processor, and at least one analog processor (e.g. a quantum processor).

Ripple: Ripple is an at least approximately periodic variation in signal. On a transmission line, for example, a ripple can be caused by an impedance mismatch that leads to generation of a standing wave.

Josephson Junction: A Josephson junction is device that includes two electrodes of material that can superconduct at or below a critical temperature characteristic of the material, and a thin insulating barrier separating the electrodes.

Weak-Link Josephson Junction: A weak-link Josephson junction is a type of Josephson junction in which a metallic constriction with dimensions of the order of the superconducting coherence length bridges two superconducting electrodes. A weak-link Josephson junction can behave as an inductance.

Flux Digital-to-Analog Converter (DAC): A flux DAC is a superconducting device in which magnetic flux quantum representations of digital signals can be established, converted into analog supercurrents, and administered to another device, e.g. a programmable device.

Preamble

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with superconductive circuits or resonators have not been shown or described in detail to avoid unnecessarily obscuring descriptions of the embodiments of the present methods. Throughout this specification and the appended claims, the words "element" and "elements" are used to encompass, but are not limited to, all such structures, systems, and devices associated with superconductive circuits and resonators.

Unless the context requires otherwise, throughout the specification and claims which follow, the word "comprise" is synonymous with "including," and is inclusive or open-ended (i.e., does not exclude additional, unrecited elements or acts).

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations.

It should be noted that, as used in this specification and the appended claims, the singular forms "a," "an," and "the" include plural referents unless the content clearly dictates otherwise. Thus, for example, reference to a readout system including "a superconducting resonator" includes a single superconducting resonator, or two or more superconducting resonators. It should also be noted that the term "or" is generally employed in its sense including "and/or" unless the content clearly dictates otherwise.

The headings provided herein are for convenience only and do not interpret the scope or meaning of the embodiments.

Single SQUID Superconducting Resonator

FIG. 1A shows a superconducting circuit 100a comprising a superconducting resonator 102 according to at least a first exemplary implementation. Superconducting resonator 102 comprises a capacitance 104, and an inductance 106, which may or may not take the form of discrete capacitors and inductors, respectively.

Superconducting resonator 102 further comprises a single SQUID loop 108. SQUID loop 108 is a DC SQUID and comprises a pair of Josephson junctions 108-1 and 108-2 in parallel with one another to form a superconducting loop. SQUID loop 108 enables tuning of a resonance frequency of superconducting resonator 102 by adjusting a SQUID flux bias.

A resonance frequency ω of superconducting resonator 102 can be determined by the following relationship for an LC circuit:

$$\omega = \frac{1}{\sqrt{(LC)}} \qquad (1)$$

where C is the value of capacitance 104 and L is the sum of geometric inductance 106 and the parallel sum of Josephson inductances from Josephson junctions 108-1 and 108-2 in SQUID loop 108.

Small fluctuations in capacitance C and/or inductance L can result in a fractional frequency perturbation of the resonance frequency as follows:

$$\frac{\delta\omega}{\omega} = \frac{-\delta C}{2C} + \frac{-\delta L}{2L} \qquad (2)$$

In one implementation, superconducting resonator 102 is a distributed resonator. In other implementations, superconducting resonator 102 is a lumped element design. A lumped element design can advantageously provide a bandwidth greater than one octave, and can reduce or minimize the extent of the electric field of superconducting resonator 102. Since a loss tangent of superconducting resonator 102 can depend on a volume of lossy dielectric exposed to the electric field of superconducting resonator 102, it can be beneficial to use a lumped element design.

In a lumped element design, capacitance 104 can be implemented using one or more capacitors. The capacitors can be interdigitated capacitors and/or parallel plate capacitors. In one implementation, capacitance 104 is implemented using a parallel plate capacitor. In one example, the capacitance of the parallel plate capacitor is approximately 2 pF.

In a lumped element design, inductance 106 can be implemented using one or more inductors. In one implementation, inductance 106 is implemented using a niobium spiral inductor. In one example, the geometric inductance of the spiral inductor is approximately 1 nH. In another implementation, inductance 106 is implemented using a spiral inductor comprising a high kinetic inductance material, for example titanium nitride (TiN) or tungsten silicide (WSi).

Energy can be stored in the kinetic energy of charge carriers in a conductor driven at AC frequencies, and the stored kinetic energy can be associated with a kinetic inductance of the conductor. The total inductance can be a sum of a geometric inductance and the kinetic inductance. The kinetic inductance can be negligible in a normal (non-superconducting) metal. The kinetic inductance of a superconductor (such as TiN or WSi) can make a significant contribution to the total inductance.

Energy stored in the inertia of superconducting pairs can contribute a kinetic inductance. The total inductance in superconducting resonator 102 can be a sum of the geometric inductance, the kinetic inductance, and the inductance of SQUID loop 108.

Circuit 100a further comprises a transmission line 110, a coupling capacitance 112, and a last shift register stage 114 (also referred to in the present application as a final shift register stage). Last shift register stage 114 comprises inductances 116 and 118, SQUID loop 120 and interface 122. Last shift register stage 114 may, for example, take the form of a Quantum Flux Parametron (QFP). Last shift register stage 114 is the endpoint of a shift register comprising one or more stages. Last shift register stage 114 is a stage that can be communicatively coupled to superconducting resonator 102 for the purposes of reading out the state of a superconducting device. In one implementation, superconducting resonator 102 is communicatively coupled to a flux shift register which, in turn, is communicatively coupled to a flux qubit.

The quantum flux parametron (QFP) is a superconducting Josephson junction device similar in structure to a shunted DC SQUID. In the present application, the term "quantum flux parametron" can refer to both the operation and the structure of the superconducting Josephson junction device.

Interface 124 can provide a flux bias to SQUID loop 108 and can be controlled by a flux digital-to-analog converter (DAC) (not shown in FIG. 1) or by an analog line, for example. Using a flux DAC can reduce the number of low-frequency analog control lines to superconducting circuit 100a. In the present application, a flux DAC is a specialized superconducting device, and is different, for example, from DACs 310a and 310b of FIG. 3 in readout system 300. A more detailed description of a flux DAC can be found, for example, in U.S. Pat. No. 8,786,476 SYSTEMS, METHODS AND APPARATUS FOR DIGITAL-TO-ANALOG CONVERSION OF SUPERCONDUCTING MAGNETIC FLUX SIGNALS.

Superconducting resonator 102 can be coupled to transmission line 110 via coupling capacitance 112. In one implementation, capacitance 112 includes a discrete capacitor. Transmission line 110 can optionally be coupled to one or more other superconducting resonators (not shown in FIG. 1). The one or more other superconducting resonators may belong to an array of superconducting resonators.

Superconducting resonator 102 is connected at node 126 to ground.

Superconducting circuit 100a can optionally include an interface 128 operable to apply a flux bias to last shift register stage 114, and superconducting circuit 100a can be operated as a superconducting transceiver circuit. Last shift register stage 114 can, for example, comprise a QFP, and can be communicatively coupled to superconducting resonator 102 for the purposes of reading out the state of a superconducting device (for example, a superconducting qubit) and/or loading data into the superconducting device.

Superconducting resonator 102 comprising single SQUID loop 108 does not enable independent tuning of the resonance frequency and the sensitivity of superconducting resonator 102. It can be desirable to have a superconducting resonator in which resonator frequency and sensitivity can be independently adjusted to provide a suitable operating point. For example, independent adjustment of resonant frequency and sensitivity can be used to compensate for frequency shifts arising from variations occurring during fabrication of superconducting circuits such as superconducting circuit 100a of FIG. 1.

Figure 1B:
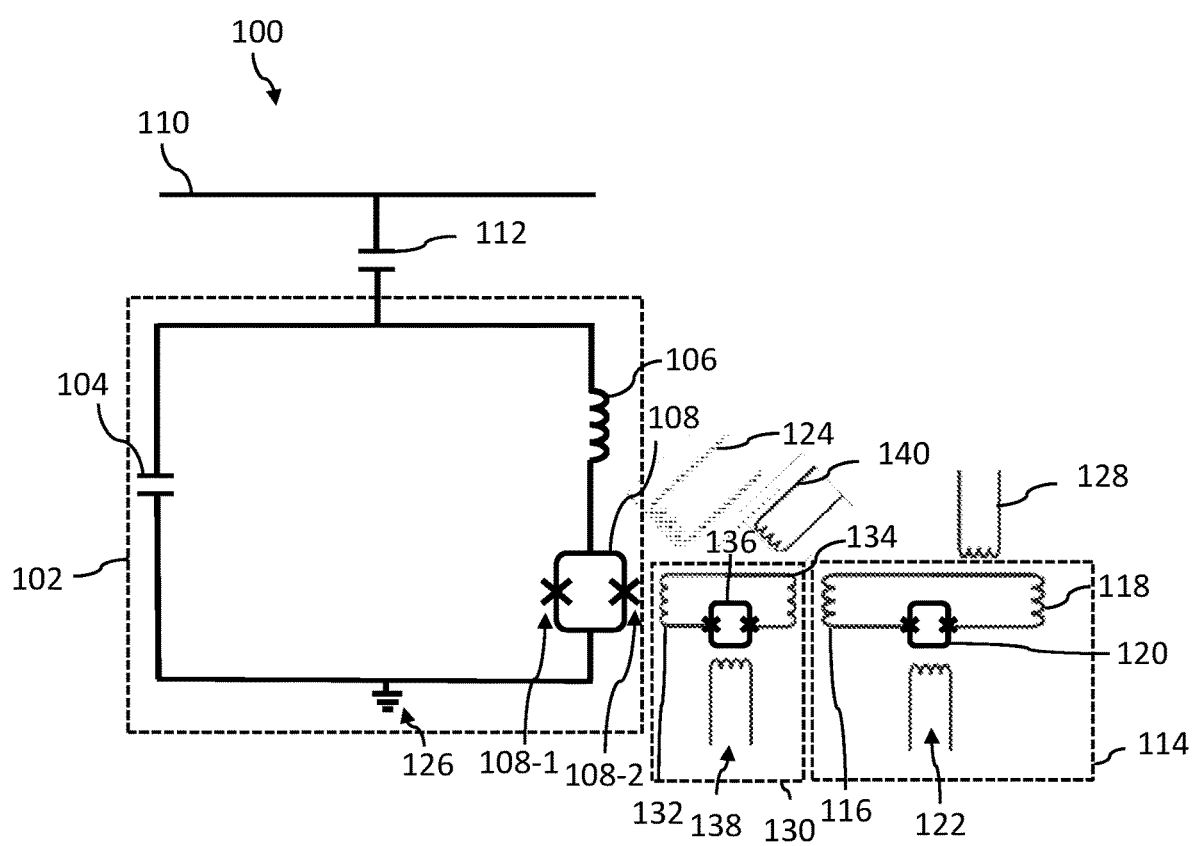
FIG. 1B is a schematic diagram illustrating an example embodiment of a superconducting circuit comprising a superconducting resonator able to tune a resonator frequency.

FIG. 1B shows a superconducting circuit 100b comprising a superconducting resonator 102 and a tunable coupler 130 according to at least a first exemplary implementation. Superconducting circuit 100b is similar in at least respects to superconducting circuit 100a, and similar or even identical structures are identified in FIG. 1B using the same reference numbers as used in FIG. 1A. Only some of the significant differences are described below.

Superconducting circuit 100b includes a tunable coupler 130 to provide inductive communicative coupling between DC SQUID 108 and last shift register stage 114. With tunable coupler 130, superconducting circuit 100b can enable independent tuning of the resonance frequency and the sensitivity to QFP flux, provided the variable loading of superconducting resonator 102 by the tunable coupler is taken into account. In one implementation, tunable coupler 130 includes two inductances 132 and 134, a DC SQUID 136, and interfaces 138 and 140.

Superconducting Resonator with Two SQUID Loops

Figure 2A:
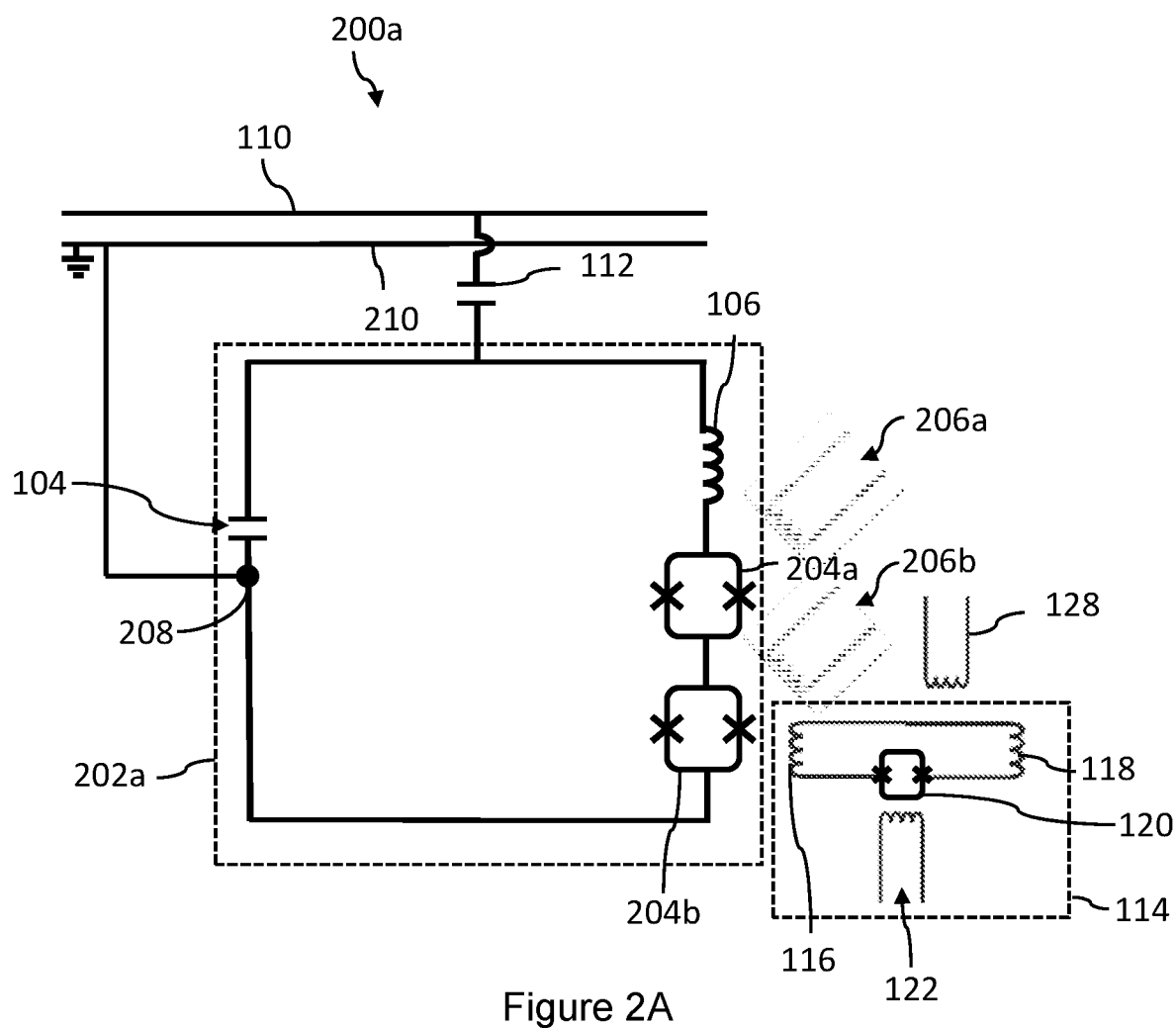
FIG. 2A is a schematic diagram illustrating a first example embodiment of a superconducting circuit comprising a superconducting resonator with two SQUID loops, able to independently tune the resonator frequency and sensitivity.

FIG. 2A shows a superconducting circuit 200a according to at least one implementation, comprising a superconducting resonator 202a with two SQUID loops, able to independently tune the resonator frequency and sensitivity. Superconducting resonator 202a comprises two SQUID loops 204a and 204b. Each of SQUID loops 204a and 204b is a DC SQUID and comprises a pair of Josephson junctions in parallel with one another to form a superconducting loop. SQUID loops 204a and 204b advantageously enable independent tuning of the resonance frequency and the sensitivity of superconducting resonator 202a by adjusting the flux bias in SQUID loops 204a and 204b, as described in PCT Patent Application No. WO2016US31885 (published as International patent application publication WO2016183213A1).

Components of superconducting circuit 200a labeled with the same numbers as in superconducting circuit 100a, 100b of FIGS. 1A and 1B are similar, or even identical, to those described in reference to FIGS. 1A and 1B.

Interfaces 206a and 206b can provide flux bias to SQUID loops 204a and 204b respectively. Once a suitable operating point has been found (see below), the flux biases provided by interfaces 206a and 206b can be static. This advantageously allows superconducting circuit 200a to use an array of flux DACs requiring only a few wires to program. The two tunable SQUID loops 204a and 204b do not need an independent analog control line for each superconducting resonator 202a.

Superconducting resonator 202a is connected at node 208 to ground, for example to a ground 210 of transmission line 110.

Superconducting circuit 200a can optionally include an interface 128 operable to apply a flux bias to last shift register stage 114 (also referred to in the present application as a final shift register stage), and can be operated as a superconducting transceiver circuit. Last shift register stage 114 can, for example, comprise a QFP, and can be communicatively coupled to superconducting resonator 202a for the purposes of reading out the state of a superconducting device (for example, a superconducting qubit) and/or loading data into the superconducting device.

Figure 2B:
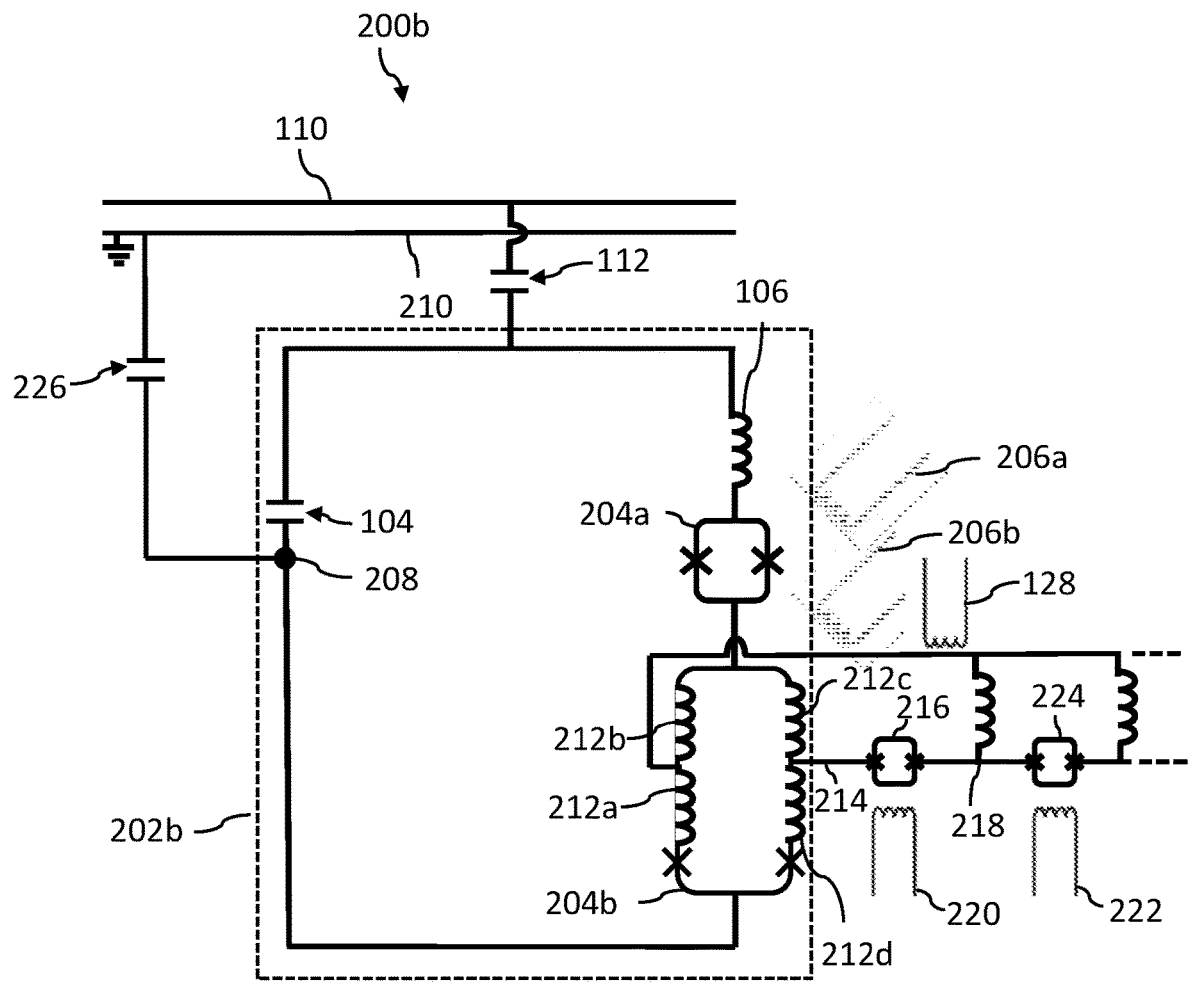
FIG. 2B is a schematic diagram illustrating a second example embodiment of a superconducting circuit comprising a superconducting resonator with two SQUID loops, able to independently tune the resonator frequency and sensitivity.

FIG. 2B is a schematic diagram illustrating a second example embodiment of a superconducting circuit 200b comprising a superconducting resonator with two SQUID loops 204a and 204b, able to independently tune the resonator frequency and sensitivity.

Superconducting resonator 202b comprises two SQUID loops 204a and 204b. Each of SQUID loops 204a and 204b is a DC SQUID and comprises a pair of Josephson junctions in parallel in a superconducting loop. SQUID loop 204b of FIG. 2B further comprises inductances 212a, 212b, 212c, and 212d (collectively referred to as 212).

SQUID loops 204a and 204b enable independent tuning of the resonance frequency and the sensitivity of superconducting resonator 202b by adjusting the flux bias in SQUID loops 204a and 204b, as described in PCT Patent Application No. WO2016US31885 (published as International patent application publication WO2016183213A1).

SQUID loop 204b is galvanically coupled to a last shift register stage 214 (also referred to in the present application as a final shift register) comprising DC SQUID 216 and inductance 218. Interfaces 220 and 222 can provide flux bias to DC SQUIDs 216 and 224 respectively.

Interfaces 206a and 206b can provide flux bias to SQUID loops 204a and 204b respectively. Superconducting resonator 202b is connected at node 208 to ground, for example to a ground 210 of transmission line 110, either directly or via optional coupling capacitor 226.

Superconducting circuit 200b can optionally include an interface 128 operable to apply a flux bias to last shift register stage 214, and can be operated as a superconducting transceiver circuit. Last shift register stage 214 can, for example, comprise a QFP, and can be communicatively coupled to superconducting resonator 202b for the purposes of reading out the state of a superconducting device (for example, a superconducting qubit) and/or loading data into the superconducting device.

Components of superconducting circuit 200b labeled with the same numbers as in superconducting circuit 100a of FIG. 1A and 100b of FIG. 1B are similar or even identical to those described in reference to FIGS. 1A and 1B. Components of superconducting circuit 200b labeled with the same numbers as in superconducting circuit 200a of FIG. 2A are similar or even identical to those described in reference to FIG. 2A.

Example Readout System

Figure 3:
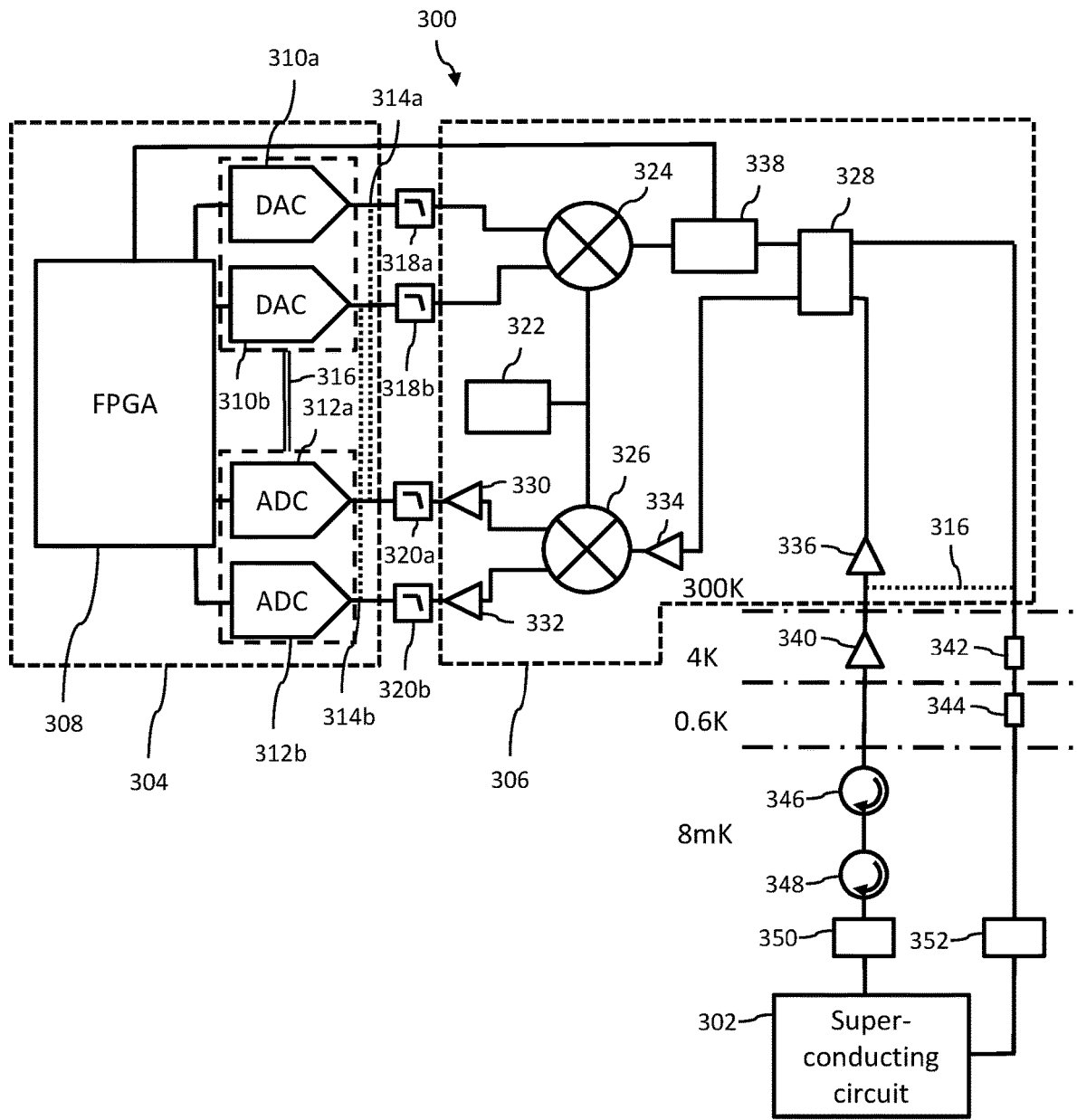
FIG. 3 is a schematic diagram illustrating an example embodiment of a readout system for a superconducting circuit.

FIG. 3 shows a readout system 300 for a superconducting circuit 302, according to at least one exemplary implementation. In the illustrated implementation, superconducting circuit 302 comprises one or more superconducting resonators (not shown in FIG. 3) such as superconducting resonator 202a of FIG. 2A. In the illustrated implementation, superconducting circuit 302 comprises a superconducting quantum processor. In other implementations, superconducting circuit 302 comprises a superconducting classical processor. In other implementations, superconducting circuit 302 comprises a superconducting device.

Readout system 300 comprises a digital board 304 and a microwave board 306. Digital board 304 comprises a Field Programmable Gate Array (FPGA) 308, two Digital-to-Analog Converters (DACs) 310a and 310b, and two Analog-to-Digital Converters (ADCs) 312a and 312b. In other embodiments, digital board 304 comprises two FPGAs, one providing output to DACs 310a and 310b, and the other providing output to ADCs 312a and 312b. In one implementation, each of DACs 310a and 310b can include a dual-channel 14-bit DAC operating at up to about 5.6 Gsps (Giga samples per second). ADCs 312a and 312b can be implemented using a multi-channel device, for example a quad-channel 10-bit ADC capable of operating in dual-channel mode at up to about 2.5 Gsps.

Readout system 300 advantageously enables independent addressing of the two side-bands of the Frequency Multiplexed Readout (FMR) spectrum. The complex received signal is given by:

$$x(n)=I(n)+jQ(n) \qquad (3)$$

where I(n) is the output of ADC 312a and Q(n) is the output of ADC 312b.

The FMR spectrum is computed as follows:

$$X_k = \frac{1}{N}\sum_{n=0}^{N-1} x(n)\left[\cos\left(\frac{2\pi kn}{N}\right) - j\sin\left(\frac{2\pi kn + 2\pi k\tau}{N}\right)\right] \qquad (4)$$

for k∈ 0, 1, 2, 3 ... N−1. The second term in the argument of the sine function depends on τ and can be used to compensate for the phase imbalance between the two mixer channels that results from the analog nature of the mixer.

Digital board 304 further comprises two loopback lines 314a and 314b, and a sync/clock connection 316. Loopback line 314a connects the output of DAC 310a to the input of ADC 312a. Loopback line 314b connects the output of DAC 310b to the input of ADC 312b.

Microwave subsystem or microwave board 306 further comprises a loopback line 316. Loopback line 316 connects the input and output to cryogenic subsystem (not shown in FIG. 3) used to cool superconducting circuit 302 to temperatures as low as a few mK.

Loopback lines 314a and 314b on digital board 304, and loopback line 316 on microwave board 306 are optional, and used when required to bypass other elements of readout system 300.

Readout system 300 further comprises two reconstruction filters 318a and 318b, and two anti-aliasing filters 320a and 320b. Reconstruction filters 318a and 318b are low-pass analog filters that can be used to produce a band-limited analog signal from a digital input. Anti-aliasing filters 320a and 320b are low-pass analog filters that can be used to band-limit a received signal in order to satisfy or approximately satisfy the sampling theorem over a band of interest.

Microwave board 306 comprises a Voltage-Controlled Oscillator (VCO)/Phase Locked Loop (PLL) 322 which provides a reference microwave signal, mixers 324 and 326, and programmable attenuators 328. Microwave board 306 further comprises amplifiers 330, 332, 334, and 336. Amplifiers 330, 332, 334, and 336 can be used to provide level control on the signal received from superconducting circuit 302. Microwave board 306 further comprises a microwave switch 338 controlled by a signal from FPGA 308 on digital board 304. In one implementation, mixers 324 and 326 are complex mixers.

The illustrated readout system 300 further comprises amplifier 340, attenuators 342 and 344, circulators 346 and 348, and DC blocks 350 and 352. DC blocks 350 and 352 are used as a thermal break on each of the input and output lines to superconducting circuit 302.

In one implementation, amplifier 340 and attenuator 342 can operate at 4 K. Attenuator 344 can operate at 0.6 K. Circulators 346 and 348, and DC blocks 350 and 352, can operate at 8 mK.

In one example implementation, using 60 resonators and a bandwidth of 2.5 GHz, a data rate of approximately 600 Mbps can be achieved for a shift register stage (SRS) operation time of 25 ns.

A method of operation of readout system 300 of FIG. 3 is described in PCT Patent Application No. WO2016US31885 (published as International patent application publication WO2016183213A1).

Frequency Multiplexed Readout (FMR) Technology for Superconducting Qubits

Figure 4:
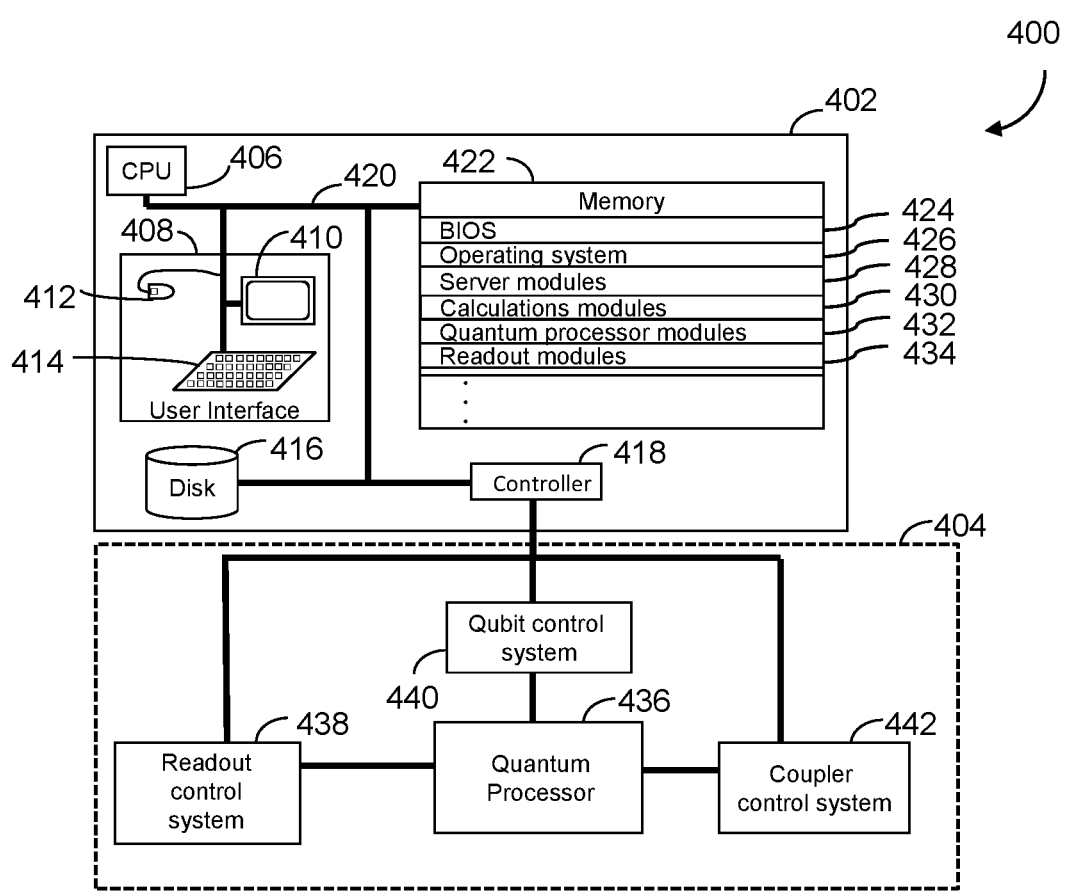
FIG. 4 is a schematic diagram of an exemplary hybrid computing system, including a digital computer and a quantum computer, that may incorporate FMR technology as described herein.

FIG. 4 shows a hybrid computing system 400 according to at least one exemplary implementation, including a digital computer 402 and a quantum computer 404, that may incorporate FMR technology as described above.

Digital computer 402 comprises CPU 406, user interface elements 408, 410, 412, and 414, disk 416, controller 418, bus 420 and memory 422. Memory 422 comprises BIOS 424, operating system 426, server modules 428, calculations modules 430, quantum processor modules 432, readout modules 434, and other modules that can be used to operate hybrid computing system 400.

Quantum computer 404 comprises quantum processor 436, readout control system 438, qubit control system 440 and coupler control system 442. Quantum computer 404 can incorporate FMR technology comprising superconducting resonators (such as superconducting resonator 202*a* of FIG. 2A). Computing system 400 can comprise a readout system such as readout system 300 of FIG. 3.

Figure 5:
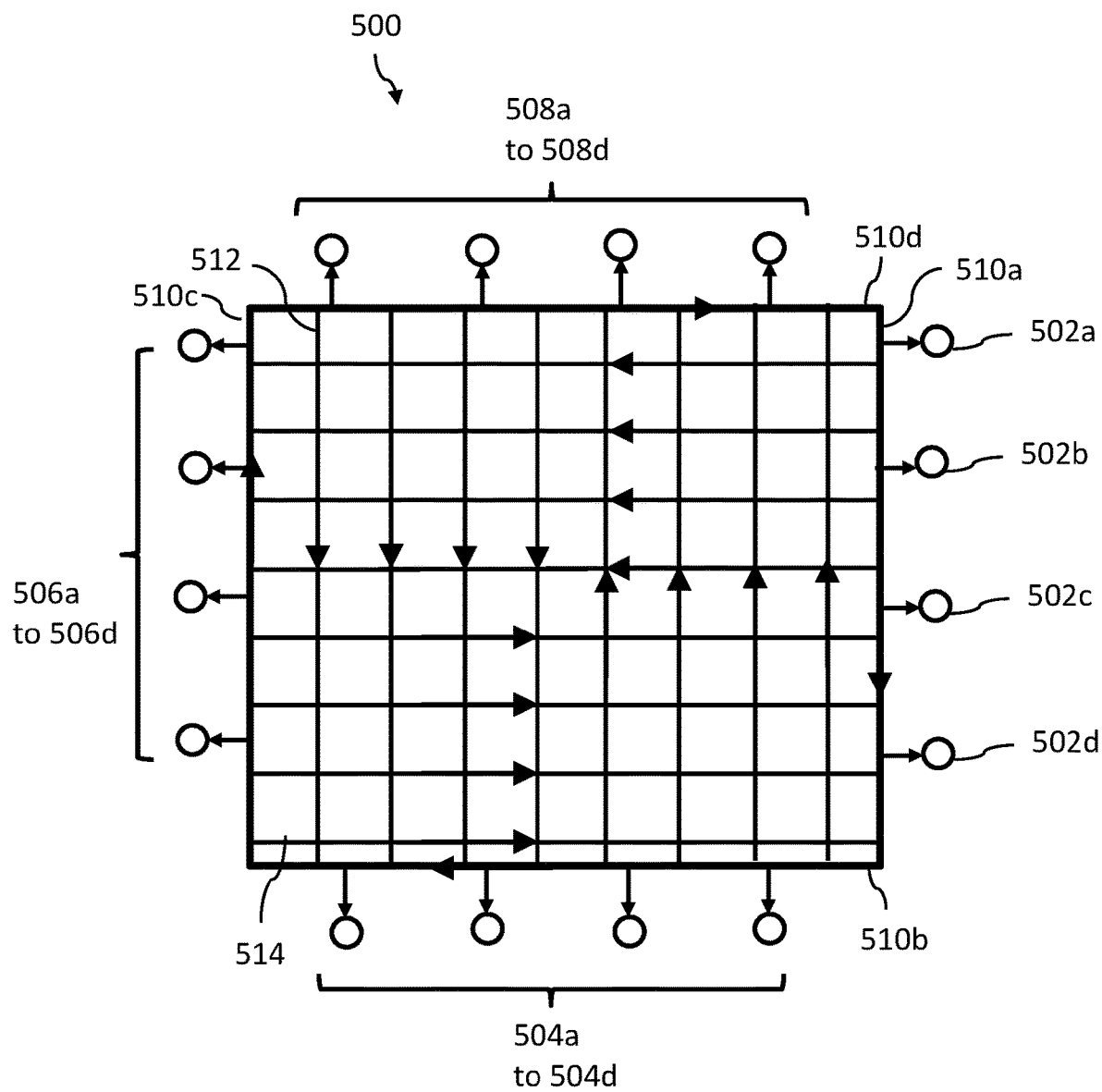
FIG. 5 is a schematic diagram illustrating a first arrangement of superconducting resonators in an example embodiment of a superconducting quantum processor.

FIG. 5 shows a first arrangement of superconducting resonators in an example implementation of a superconducting quantum processor 500. Processor 500 comprises 64 unit cells (not shown in FIG. 5) with four sets of superconducting resonators 502*a* through 502*d* (collectively superconducting resonators 502), 504*a* through 504*d* (collectively superconducting resonators 504), 506*a* through 506*d* (collectively superconducting resonators 506), and 508*a* through 508*d* (collectively superconducting resonators 508), coupled to outer shift registers 510*a* through 510*d* (collectively outer shift registers 510) respectively. Each unit cell comprises N qubits. In one embodiment, N=8. Processor 500 comprises eight vertically oriented inner shift registers 512 and eight horizontally oriented inner shift registers 514.

All four sets of superconducting resonators 502, 504, 506, and 508 are coupled to a transmission line, for example line 110 of FIG. 2A (not shown in FIG. 5). In one implementation, all four sets of superconducting resonators 502, 504, 506, and 508 are coupled to a single common transmission line.

Each arrow in FIG. 5 indicates the direction data flows through a respective shift register of inner shift registers 512 and outer shift registers 510 in normal operation.

Figure 6:
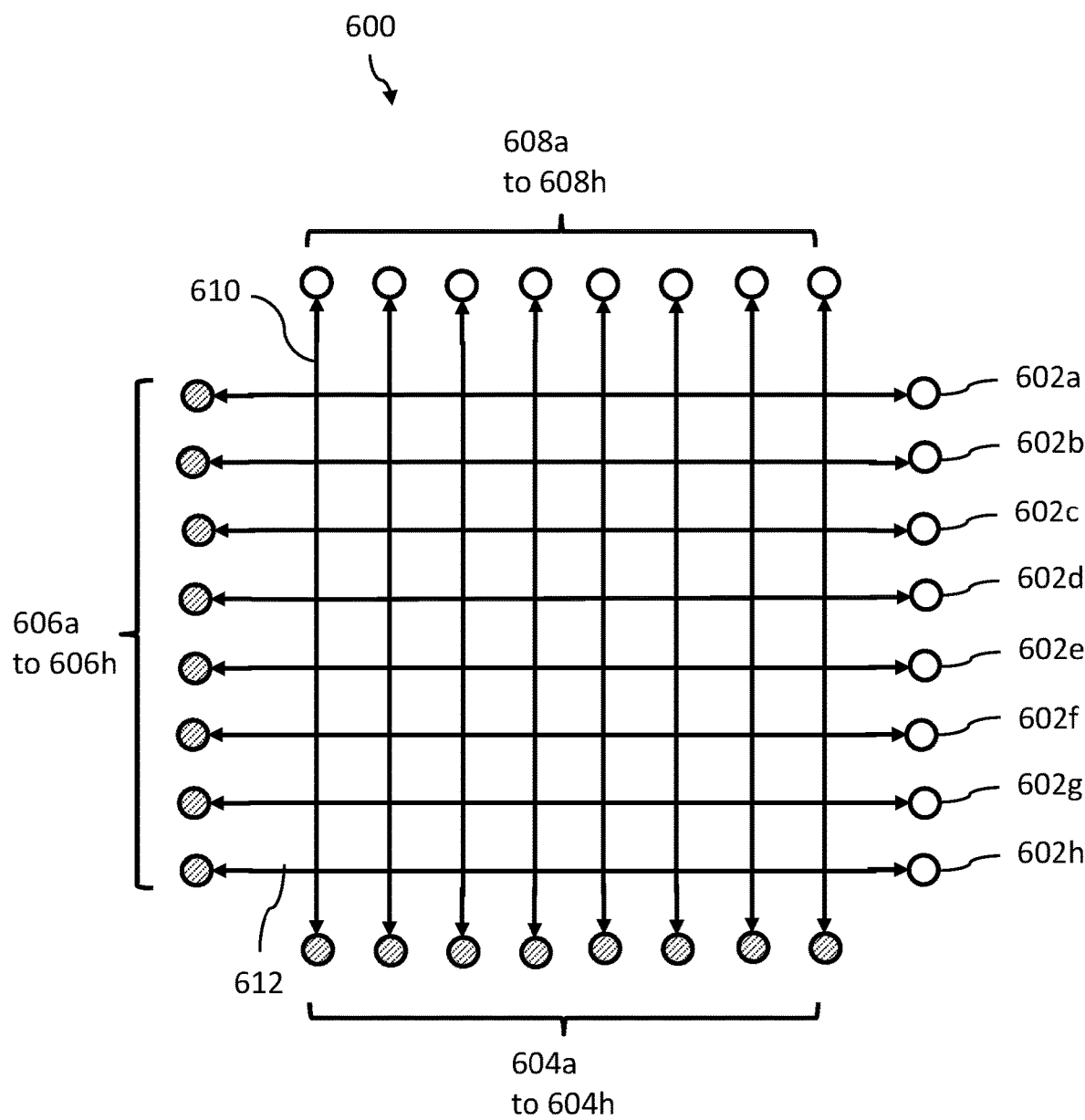
FIG. 6 is a schematic diagram illustrating a second arrangement of superconducting resonators in an example embodiment of a superconducting quantum processor.

FIG. 6 shows a second arrangement of superconducting resonators in an example implementation of a superconducting quantum processor 600. Processor 600 comprises 64 qubits (not shown in FIG. 6) with four sets of superconducting resonators 602*a* through 602*h* (collectively superconducting resonators 602), 604*a* through 604*h* (collectively superconducting resonators 604), 606*a* through 606*h* (collectively superconducting resonators 606), and 608*a* through 608*h* (collectively superconducting resonators 608). Processor 600 comprises eight vertically oriented inner shift registers 610 and eight horizontally oriented inner shift registers 612.

Two sets of superconducting resonators 602 and 608 are coupled to a first transmission line such as line 110 of FIG. 2A (not shown in FIG. 6). The other two sets of superconducting resonators 604 and 606 (shown shaded in FIG. 6) are coupled to a second transmission line (also not shown in FIG. 6).

In the arrangement illustrated in FIG. 6, outer shift registers (such as outer shift registers 510 of FIG. 5) are not needed. With eight resonators on a side, one for each of the inner shift registers (horizontal or vertical), there is sufficient fault tolerance provided by the cross-over stages of the horizontally and vertically oriented inner shift registers.

The present technology can load data into a shift register on a quantum processor chip using a frequency multiplexed resonator. The frequency multiplexed resonator readout described above (with reference to FIGS. 1, 2A, 2B, 3, 4, 5, and 6) can be run in reverse to allow data to be passed to the processor. In some implementations, a first stage QFP can be used to rectify a microwave signal in the resonator if a signal is present.

The present technology can be used to input data to the processor as well as to readout qubit states from the processor. The same lines can be used for both input and readout (see, for example, PCT Patent Application No. WO2016US31885, published as International patent application publication WO2016183213A1).

In some implementations, the frequency multiplexed resonator input system described above, which can be used to input data to superconducting devices, is used in combination with the frequency multiplexed resonator readout system also described in the present disclosure (with reference to FIGS. 1, 2A, 2B, 3, 4, 5, and 6). In other implementations, the frequency multiplexed resonator input system described above is used in combination with other readout systems or circuits. For example, in one of the other implementations, the frequency multiplexed resonator input system is used in combination with the superconducting flux qubit readout system described in U.S. Pat. No. 8,854,074 "SYSTEMS AND METHODS FOR SUPERCONDUCTING FLUX QUBIT READOUT".

An example embodiment of a frequency multiplexed resonator input/output system is illustrated in FIG. 3 (described above with reference to the readout system). A return pathway in FIG. 3 comprises DC block 350, circulators 348 and 346, amplifiers 340, 336, 334, 332, 330, attenuator 328, mixer 326, filters 320*a* and 320*b*, and ADC 312*a* and 312*b*. If the system of FIG. 3 is to be used for inputting data to the superconducting devices only (and no readout), then the return pathway may be omitted.

Superconducting Transmission Line Design for Strongly-Coupled Resonator Arrays

A frequency-multiplexed resonant readout (FMRR) system can use an array of superconducting shunt-coupled resonators strongly coupled to a superconducting transmission line to perform high-speed readout. The FMRR system can perform readout of a quantum computer (for example, a quantum annealer).

In some implementations, one or more resonators of the array of superconducting shunt-coupled resonators strongly coupled to the superconducting transmission line include one or more capacitors. In some implementations, the strength of a coupling between a superconducting shunt-coupled resonator and a superconducting transmission line can be increased by using a larger coupling capacitance. Proximity of a capacitor in one of the resonators to the superconducting transmission line can cause a local perturbation of the transmission line impedance, for example in a vicinity of the resonator. In some implementations, a larger capacitance can cause a larger local perturbation of the transmission line impedance.

In some implementations, a superconducting transmission line can be coupled to a relatively small array of superconducting resonators, each superconducting resonator coupled to the transmission line by a respective coupling capacitance having a relatively large value. The total parallel capacitance can cause a deviation from a characteristic impedance of the transmission line (for example a 50Ω impedance). A 50Ω impedance is a typical characteristic impedance of a transmission line, and is a typical specification for commercial microwave components.

In other implementations, a superconducting transmission line can be coupled to a relatively large array of superconducting resonators, each superconducting resonator coupled to the transmission line by a respective coupling capacitance having a relatively small value. Similarly, the total parallel capacitance can cause a deviation from a characteristic impedance of the transmission line (for example. a 50Ω impedance).

A deviation in the characteristic impedance of the transmission line can depend on a combined parallel capacitance. For example, a deviation in the characteristic impedance of the transmission line can depend on a combined loading of more than one resonator. The resonators can be neighboring resonators. A deviation in the characteristic impedance of the transmission line can depend on other factors.

A deviation from a design impedance over the length of the resonator array can cause ripple or ripples, and can change the strength of coupling between the resonator and the superconducting transmission line. In some instances, the strength of coupling can be changed from a design value or a desired value.

The transmission line impedance $Z_0$ can be expressed as follows:

$$Z_0 = \sqrt{\frac{L_0}{C_0 + C'}} \quad (5)$$

where $L_0$ is the transmission line inductance, $C_0$ is the transmission line capacitance, and C' is the stray capacitance from the presence of the array of superconducting shunt-coupled resonators.

A change to the impedance of the transmission line caused by the presence of stray capacitance C' can, in turn, affect the strength of coupling of one or more resonators to the transmission line. The strength of coupling can be characterized, for example, by an external quality factor $Q_{EXT}$, defined such that a lower value of $Q_{EXT}$ corresponds to a stronger coupling between the resonator and the transmission line. The impact of an impedance change on the strength of the coupling between a resonator and a transmission line can depend on the type of coupling.

For the example of a shunt-coupled resonator, the external quality factor can be expressed at least approximately as follows:

$$Q_{EXT} \approx \frac{2}{Z_0 \times L_R \times \omega_0^3 \times C_C^2} \quad (6)$$

where $L_R$ is the inductance of the resonator, $\omega_0$ is the resonant frequency of the resonator, and $C_C$ is the capacitance of a coupling capacitor between the resonator and the transmission line.

Since $Q_{EXT}$ is inversely proportional to $Z_0$, a stray capacitance C' contributed by a resonator proximate the transmission line can cause an increase in the value of $Q_{EXT}$, thereby causing the resonators to be coupled more weakly than in the absence of this effect.

A weaker coupling can cause a weaker resonance. In one example scenario of a shunt-coupled resonator model, the depth of a resonance was reduced by more than 4 dB when the value of $Q_{EXT}$ was doubled.

One approach for mitigating the effect of an impedance change on the strength of coupling is to drive each resonator at a power individually selected to compensate for its modified coupling to the transmission line. A shortcoming of this approach can be that it may be necessary to provide an in-situ calibration of each resonator's coupling to the transmission line, by sweeping through power levels, and looking for an onset of resonator nonlinearity. An in-situ calibration can be time-consuming, and it may be necessary for the system to include a generator with a wider dynamic range.

The value of $Q_{EXT}$ can vary along the length of a transmission line, and can depend on a number of factors including the number of superconducting resonators coupled to the transmission line, the values of the coupling capacitances, and the spacing between superconducting resonators.

Another approach for mitigating the effect of an impedance change on the strength of coupling is to spread out the additional coupling capacitance along the transmission line to minimize, or at least reduce, the additional coupling capacitance per unit length. One example implementation is to use λ/4 distributed-element resonators capacitively coupled to the transmission line over a distance of a few hundred microns.

In one scenario, distributed-element coupling can be implemented using a high-quality silicon substrate for a capacitor dielectric. In the case of a multi-layer fabrication stack, where circuit elements are overlaid by a dielectric such as silicon dioxide, distributed-element coupling can be lossy.

A distributed readout resonator design can have a larger footprint than a lumped-element design. For example, a distributed-element design can have a footprint of approximately 400×600 µm², whereas a lumped-element design can have a footprint of approximately 100×100 µm². A desire for a smaller footprint can drive a lumped-element implementation of shunt-coupled resonators strongly-coupled to a transmission in a multi-layer stack.

An interaction between a transmission line and a resonator, as described above, can be more important for more strongly-coupled resonators. While weaker coupling allows more resonators to be packed into a given bandwidth, and weaker coupling may be sufficient for slower readout times, commercial applications where readout speed is important (such as commercial quantum computing applications) may advantageously employ stronger coupling.

Higher readout speed may also be achieved by including additional resonators. A data rate of N weakly-coupled resonators, each with linewidth W, can be at least similar to a data rate of a strongly-coupled resonator with line width N×W. The N weakly-coupled resonators may advantageously spatially distribute a perturbation to the transmission line.

Coupling strength may advantageously be selected based at least in part on topological considerations and/or to at least attempt to match clock domains. For example, it can be advantageous to end each shift register with a detector which makes the number of resonators equal to twice the sum of the number of rows and the number of columns. FIG. 5 illustrates an example topology.

The coupling of a resonator to a transmission depends at least in part on the linewidth of a resonator. The linewidth can be determined by dividing the available bandwidth by the linewidth and by an additional factor selected to provide enough room between resonances in the frequency domain.

In one example implementation, the available bandwidth is 2.5 GHz. In one example implementation, the additional factor is 4.

A shift register can operate at a speed set by driving electronics. It can be advantageous for the detectors to match or exceed the speed set by the driving electronics. If, for example, the detector is faster than the shift register, it can be an inefficient use of available bandwidth. In an example implementation, a shift register delivers data every 100 ns, and resonances are coupled to provide a response time of 20 ns. Coupling them twice as strongly may reduce a full duty cycle time from 120 ns to 110 ns. The reduction in full duty cycle time is only a marginal improvement yet requires twice the FMRR bandwidth. At least for this reason, it can be advantageous for the detector to match the shift register speed.

As described above, proximity of resonators to a superconducting transmission line can cause an undesirable level of ripple when measured in transmission, and can have an undesirable variation in the coupling strength of resonators as a function of the position of the resonators along the transmission line. The impact can include a limit on the number of usable resonators in a frequency-multiplexed resonant readout system, with a concomitant slowdown in readout speed and less redundancy. Distributed-element approaches typically rely on a single metal-layer fabrication stack and use a large footprint.

The systems and methods described in the present application support a smaller, and more flexible footprint, and a multi-layer fab stack. In one approach, at least one inductance is introduced into the center line of the transmission line. The inductance can modify a characteristic impedance of the transmission line. In one implementation, the impedance is selected to at least partially compensate for variations in the impedance of the transmission line, for example to at least partially compensate for local variations in the impedance of the transmission line caused by proximity of a capacitance in a microwave superconducting resonator coupled to the transmission line.

In one implementation, lumped-element inductors are introduced into the center line of the transmission line, at least one on each side of each resonator. At least one lumped-element inductor is introduced into the center line of the transmission line upstream of the resonator, and at least one lumped-element inductor is introduced into the center line of the transmission line downstream of the resonator. Each lumped-element inductor can be selected to compensate for a local change in impedance caused by a respective coupled resonator.

In some implementations, it can be beneficial to have a pair of inductors introduced into the center line of the transmission line, one on each side of the resonator, and such that the transmission line appears to have an impedance of 50Ω when seen from upstream and downstream of the resonator.

A configuration of one or more inductances added to the transmission line can depend on a position of the resonator along the transmission line and a spacing of resonators in an array of superconducting resonators. A value of the one or more inductances can be selected to compensate for a local perturbation to the characteristic impedance of the transmission line. The arrangement of inductances can be symmetric or asymmetric. The configuration of inductances can vary from one superconducting resonator in the array of superconducting resonances to another.

It can be desirable to select and arrange the compensating inductances to maintain the characteristic impedance of the transmission line at approximately 50Ω. The effect of a compensating inductance for a superconducting resonator on the characteristic impedance of the transmission line can vary with a position of the superconducting resonator along the length of the transmission line e.g. whether the superconducting resonator is close to one end of the transmission line or near the middle of the transmission line. For example, a symmetric configuration of a pair of inductances may provide a preferred level of compensation in the middle of a transmission line, and an asymmetric configuration of inductances may provide a preferred level of compensation near an end of the transmission line.

Any suitable method can be used to estimate the preferred values and arrangement of compensating inductances for an array of superconducting resonators. A first-order analysis may be sufficient for practical purposes in some applications.

The value of a compensating inductance can be estimated by any suitable method including, but not limited to, the methods described below. For example, an iterative method can be used to estimate the value of compensating inductances for an array of superconducting resonators. In one implementation, the iterative method can at least partially take into account an interdependency between compensating inductances. For example, the iterative method can include iteratively adjusting the value of a compensating inductance of a set of compensating inductances so that, for other compensating inductances in the set of compensating inductances, the transmission line appears to have an impedance of 50Ω.

The value of a compensating inductance $L_{comp}$ can be estimated using the following relationship:

$$L_{comp} = Z_0^2 C_{eff} \tag{7}$$

where $Z_0$ is a characteristic impedance of the transmission line, and $C_{eff}$ is an effective capacitance of the shunt-coupled resonator.

As described above, the effect of a coupling capacitor coupling a superconducting resonator to the transmission line can be a local perturbation of the impedance of the transmission line. In some implementations, one or more compensating inductances are introduced into the transmission line in proximity to the superconducting resonator. In other implementations, one or more compensating inductances are introduced in other suitable configurations, for example further away from the superconducting resonator.

Figure 7A:
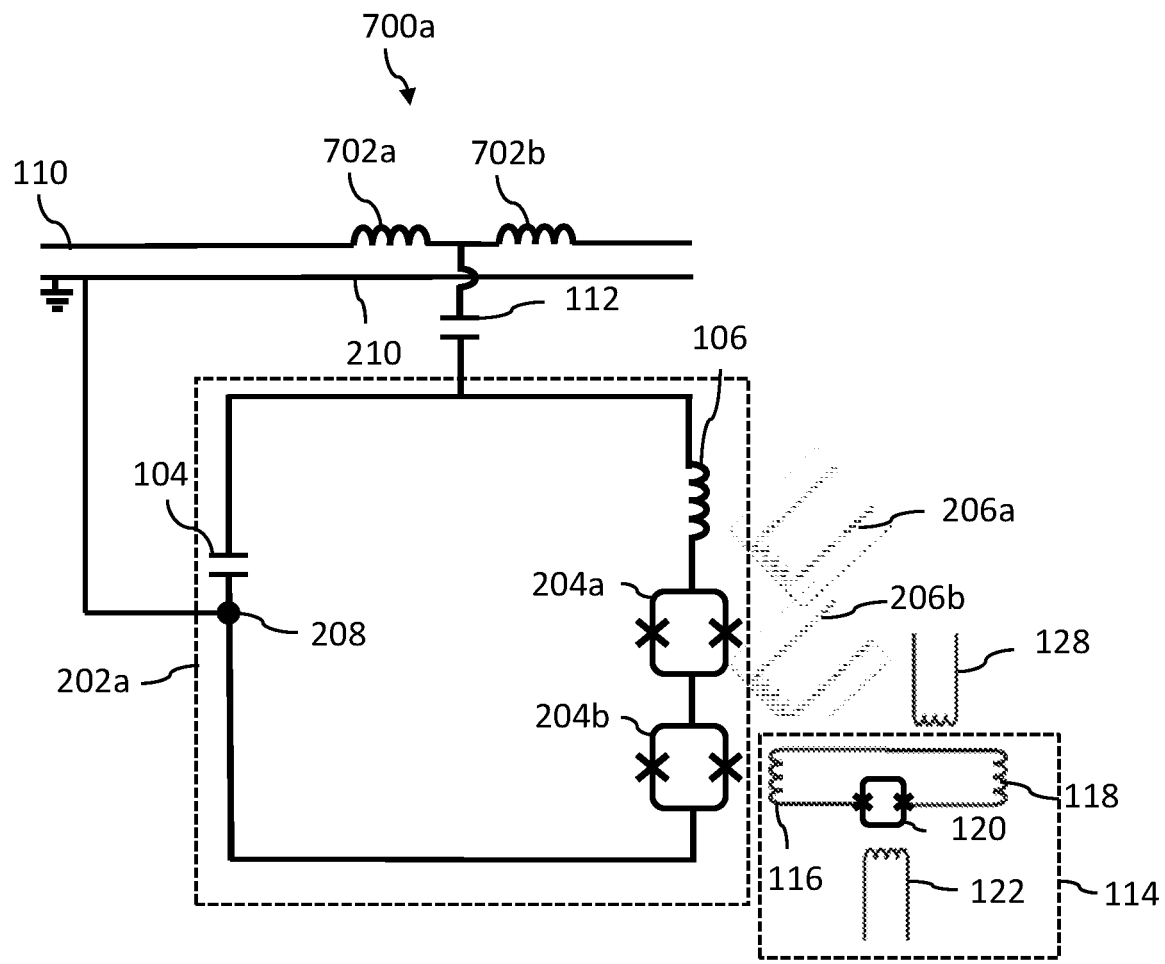
FIG. 7A is a schematic circuit diagram illustrating a first example superconducting circuit of a shunt-coupled resonator according to the present disclosure.

FIG. 7A is a schematic circuit diagram illustrating a first example superconducting circuit 700a of a shunt-coupled resonator according to the present disclosure. Superconducting circuit 700a includes a superconducting resonator 202a (comprising elements encompassed by a broken-line box in FIG. 7A). Superconducting resonator 202a comprises two SQUID loops 204a and 204b able to independently tune a frequency and a sensitivity of superconducting resonator 202a. Each of SQUID loops 204a and 204b is a DC SQUID that comprises a pair of Josephson junctions (represented by crosses in FIG. 7A) in parallel with one another to form a superconducting loop. SQUID loops 204a and 204b advantageously enable independent tuning of the resonance frequency and the sensitivity of superconducting resonator 202a by adjusting the flux bias in SQUID loops 204a and 204b.

Components of superconducting circuit 700a labeled with the same numbers as in superconducting circuit 100a, 100b of FIGS. 1A and 1B, respectively, and/or superconducting circuit 200a of FIG. 2A are similar, or even identical, to those described in reference to FIGS. 1A, 1B and 2A, respectively.

Superconducting resonator 202a includes a capacitance 104 and an inductance 106. Interfaces 206a and 206b can provide flux bias to SQUID loops 204a and 204b respectively. Superconducting resonator 202a is connected at node 208 to ground, for example to a ground 210 of transmission line 110.

Superconducting circuit 700a can optionally include an interface 128 operable to apply a flux bias to last shift register stage 114 (also referred to in the present application as final shift register stage 114). Interface 128 can be operated as a superconducting transceiver circuit. Last shift register stage 114 (comprising elements encompassed by a broken-line box in FIG. 7A) can, for example, comprise a QFP. Last shift register stage 114 can be communicatively coupled to superconducting resonator 202a for the purposes of reading out the state of a superconducting device and/or loading data into a superconducting device.

Superconducting circuit 700a includes inductances 702a and 702b. Inductance 702a can include a lumped-element magnetic inductance, a distributed magnetic inductance, a lumped-element kinetic inductance and/or a distributed kinetic inductance. Inductance 702b can include a lumped-element magnetic inductance, a distributed magnetic inductance, a lumped-element kinetic inductance and/or a distributed kinetic inductance.

In one implementation, each of inductances 702a and 702b includes a respective lumped-element inductance. In another implementation, at least one of inductances 702a and 702b includes a distributed-element inductance. In yet another implementation, at least one of inductances 702a and 702b includes a kinetic inductance.

Inductance 702a is on one side of the transmission line relative to superconducting resonator 202a, and inductance 702b is on the other side of the transmission line relative to superconducting resonator 202a. In one implementation, inductance 702a is upstream of superconducting resonator 202a, and inductance 702b is downstream of superconducting resonator 202a, with respect to a direction of signal flow.

Figure 7B:
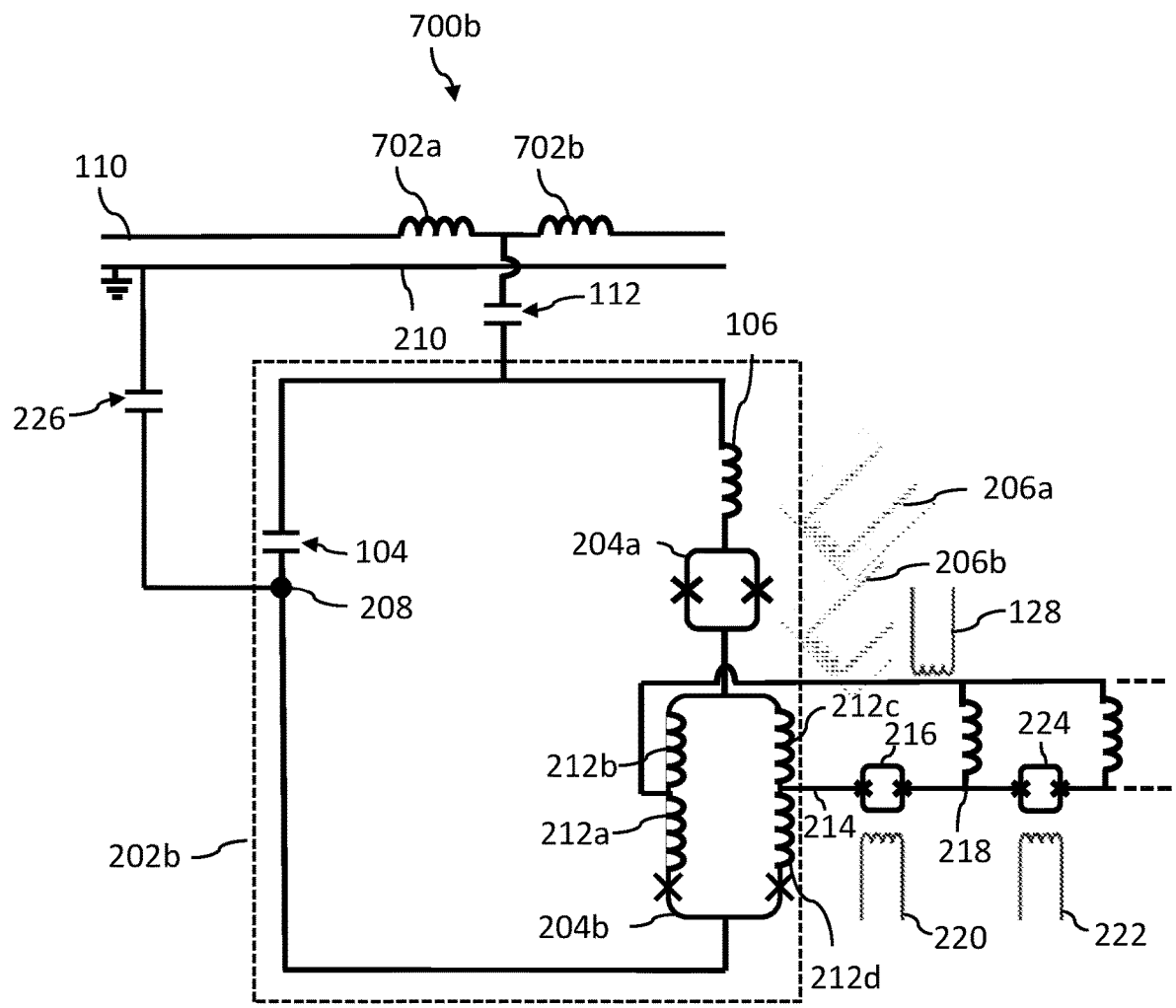
FIG. 7B is a schematic circuit diagram illustrating a second example superconducting circuit of a shunt-coupled resonator according to the present disclosure.

FIG. 7B is a schematic circuit diagram illustrating a second example superconducting circuit 700b of a shunt-coupled resonator according to the present disclosure.

Superconducting circuit 700b includes a superconducting resonator 202b (comprising elements encompassed by a broken-line box in FIG. 7B) that includes two SQUID loops 204a and 204b. Each of SQUID loops 204a and 204b is a DC SQUID that comprises a pair of Josephson junctions (represented by crosses) in parallel to form a superconducting loop. SQUID loop 204b of FIG. 7B further comprises inductances 212a, 212b, 212c, and 212d. SQUID loops 204a and 204b can enable independent tuning of a resonance frequency and a sensitivity of superconducting resonator 202b. Tuning can include adjusting a flux bias in SQUID loops 204a and 204b.

SQUID loop 204b is galvanically coupled to a last shift register stage 214 comprising DC SQUID 216 and inductance 218. Interfaces 220 and 222 can provide flux bias to DC SQUIDs 216 and 224 respectively.

Interfaces 206a and 206b can provide flux bias to SQUID loops 204a and 204b respectively. Superconducting resonator 202b is connected at node 208 to ground, for example to the ground 210 of transmission line 110, either directly or via optional coupling capacitor 226.

Superconducting circuit 700b can optionally include an interface 128 operable to apply a flux bias to last shift register stage 214. Interface 128 can be operated as a superconducting transceiver circuit. Last shift register stage 214 can, for example, comprise a QFP, and can be communicatively coupled to superconducting resonator 202b for the purposes of reading out the state of a superconducting device and/or loading data into a superconducting device.

Components of superconducting circuit 700b labeled with the same numbers as in superconducting circuit 100a of FIG. 1A and 100b of FIG. 1B are similar or even identical to those described in reference to FIGS. 1A and 1B. Components of superconducting circuit 700b labeled with the same numbers as in superconducting circuit 200a of FIG. 2A are similar or even identical to those described in reference to FIG. 2A.

Superconducting circuit 700b includes inductances 702a and 702b. In one implementation, inductances 702a and 702b are lumped-element inductances. In another implementation, at least one of inductances 702a and 702b includes a distributed-element inductance. In yet another implementation, at least one of inductances 702a and 702b includes a kinetic inductance.

Circuits 700a and 700b each include coupling capacitance 112 (also referred to in the present application as coupling capacitance $C_C$) and shunt capacitance 104 (also referred to in the present application as shunt capacitance $C_S$). The effective capacitance $C_{eff}$ of the shunt-coupled resonator of FIG. 7A can be at least estimated using the following expression:

$$C_{eff} = \frac{C_C C_S}{C_C + C_S} \tag{8}$$

Effective capacitance $C_{eff}$ can be approximately equal to coupling capacitance $C_C$ ($C_{eff} \approx C_C$) when coupling capacitance $C_C$ is much less than shunt capacitance $C_S$ ($C_C \ll C_S$).

In another implementation of circuit 700a and/or 700b, a kinetic inductance can be introduced into the center line of the transmission line. The kinetic inductance can be provided by a kinetic inductor. Each kinetic inductor can be placed in-line with the center pin of the transmission line close to a respective resonator. An advantage of this positioning is that compensation has little or no effect on the transmission line geometry. A kinetic inductance can be provided by a length of wire, and the length can be at least estimated by the following relationship:

$$l = w \frac{L_{comp}}{L_S} \quad (9)$$

where w is the width of the center pin of the transmission line, $L_{comp}$ is an inductance selected to compensate at least approximately for the resonator capacitance, and $L_S$ is an inductance per square for material used to fabricate the kinetic inductor.

The length of a kinetic inductor of a given thickness and material for providing a suitable compensating inductance can be estimated or can be determined empirically. In a first example implementation, a kinetic inductor is fabricated using titanium nitride (TiN), where the thickness of the kinetic inductor is 50 nm, inductance per square $L_S$ is 15 pH, compensating inductance $L_{comp}$ is 40 pH, and length l is 1.3 μm. In a second example implementation, a kinetic inductor is fabricated using titanium nitride (TiN), where the thickness of the kinetic inductor is 50 nm, inductance per square $L_S$ is 15 pH, compensating inductance $L_{comp}$ is 120 pH, and length l is 4.0 μm.

In a third example implementation, a kinetic inductor is fabricated using niobium nitride (NbN), where the thickness of the kinetic inductor is 35 nm, inductance per square $L_S$ is 7 pH, compensating inductance $L_{comp}$ is 40 pH, and length l is 2.9 μm. In a fourth example implementation, a kinetic inductor is fabricated using niobium nitride (NbN), the thickness of the kinetic inductor is 50 nm, inductance per square $L_S$ is 7 pH, compensating inductance $L_{comp}$ is 120 pH, and length l is 8.6 μm.

In example implementations such as the first, second, and third example implementations above, the line width of the kinetic inductor is 0.5 μm.

In one implementation, a superconducting transmission line is a coaxial transmission line. In another implementation, a superconducting transmission line is a co-planar waveguide. Lumped-element magnetic inductances and/or kinetic inductances can be placed near one or more resonators of an array of superconducting resonators in accordance with the present disclosure to compensate for local changes to impedance of a coaxial transmission line and/or a co-planar transmission line.

In some implementations, it can be preferable (for example, for ease of fabrication) to use lumped-element inductors (also referred to in the present application as lumped-element magnetic inductances) to compensate a co-planar waveguide transmission line, and to use kinetic inductors (also referred to in the present application as lumped-element kinetic inductances) to compensate a co-axial transmission line.

In one implementation, the capacitance in the superconducting resonator (for example, capacitance 104 in resonator 202a of FIG. 7A) has a high-quality factor (Q). In one implementation, the capacitance in the superconducting resonator is a superconducting parallel plate capacitor with a thin, high-permittivity dielectric. A parallel-plate design with a thin dielectric can reduce the volume of dielectric for a given capacitance value. Reducing the volume of lossy dielectric can lead to a decrease in the required power to saturate a superconducting resonator such as superconducting resonator 202a of FIG. 7A. It can also provide a reduced capacitor footprint which is an advantage where chip space is at a premium.

In one implementation, a superconducting parallel plate thin-layer capacitor is integrated in a heterogeneous multi-layer planarized fabrication stack with deposited dielectrics. A method for fabricating a thin-layer capacitor suitable for use in a superconducting resonator is described in PCT Patent Application No. WO2016US31885 (published as International patent application publication WO2016183213A1) "FREQUENCY MULTIPLEXED RESONATOR INPUT AND/OR OUTPUT FOR A SUPERCONDUCTING DEVICE".

Figure 8A:
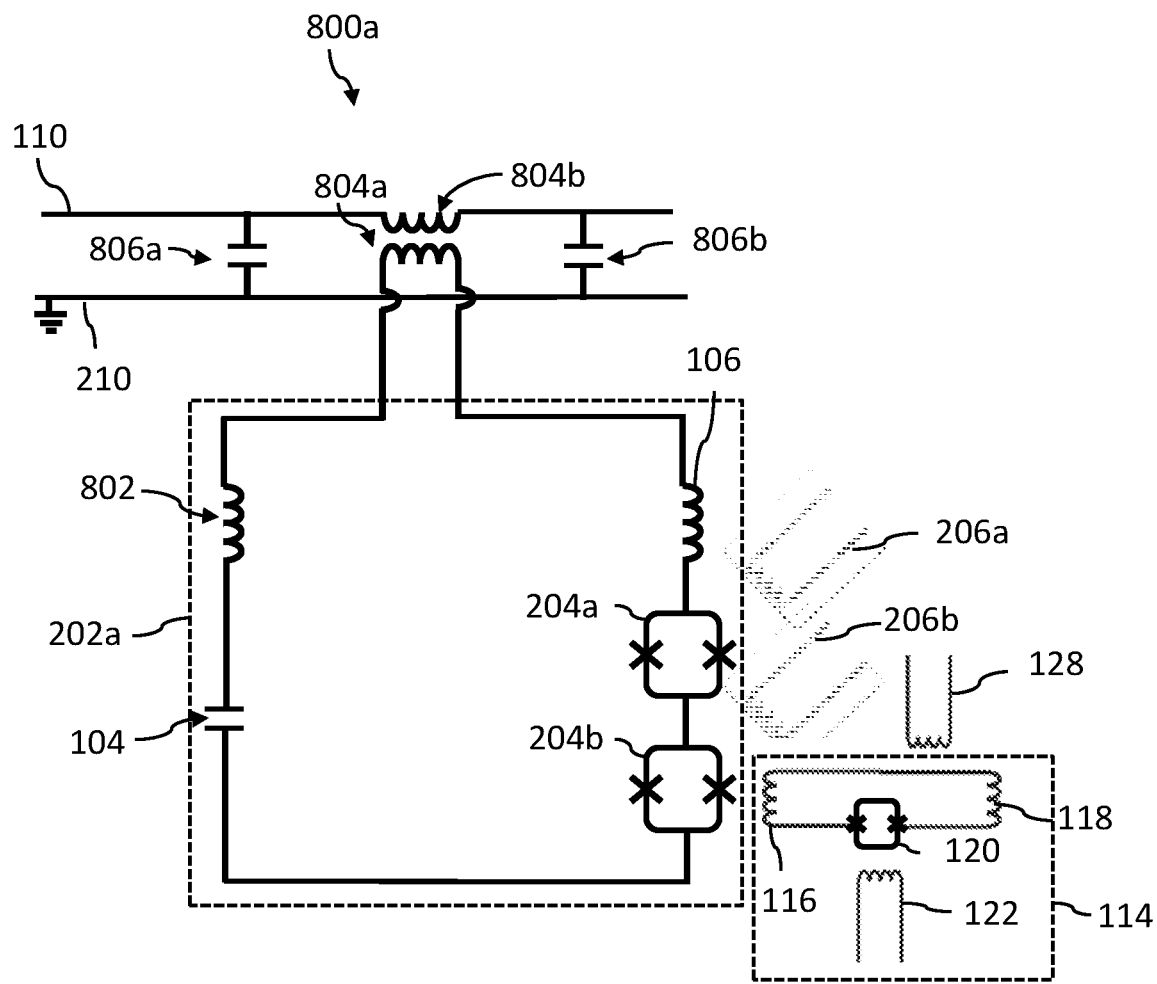
FIG. 8A is a schematic circuit diagram illustrating a first example superconducting circuit of an inductively-coupled resonator according to the present disclosure.

In one implementation of an array of superconducting resonators coupled to a superconducting transmission line, a superconducting resonator can be inductively coupled to the superconducting transmission line. FIG. 8A is a schematic circuit diagram illustrating a first example superconducting circuit 800a of an inductively-coupled resonator according to the present disclosure.

Superconducting circuit 800a includes a superconducting resonator 202a (comprising elements encompassed by a broken-line box in FIG. 8A) that includes two SQUID loops 204a and 204b. Each of SQUID loops 204a and 204b is a DC SQUID that comprises a pair of Josephson junctions (represented by crosses in FIG. 8A) in parallel to form a superconducting loop. SQUID loops 204a and 204b advantageously enable independent tuning of a resonance frequency and a sensitivity of superconducting resonator 202a by adjusting a flux bias in SQUID loops 204a and 204b.

SQUID loop 204b is inductively coupled to a last shift register stage 114. Interfaces 206a and 206b can provide flux bias to SQUID loops 204a and 204b respectively.

Superconducting circuit 800a can optionally include an interface 128 operable to apply a flux bias to last shift register stage 114, and can be operated as a superconducting transceiver circuit. Last shift register stage 114 can, for example, comprise a QFP, and can be communicatively coupled to superconducting resonator 202a for the purposes of reading out the state of a superconducting device and/or loading data into a superconducting device.

Components of superconducting circuit 800a labeled with the same numbers as in superconducting circuit 100a of FIG. 1A and 100b of FIG. 1B are similar or even identical to those described in reference to FIG. 1. Components of superconducting circuit 800a labeled with the same numbers as in superconducting circuit 200a of FIG. 2A are similar or even identical to those described in reference to FIG. 2A.

Superconducting resonator 202a includes inductance 802. In one implementation, the value of inductance 802 is approximately the same as the value of inductance 106.

Superconducting circuit 800a includes inductances 804a and 804b to inductively couple superconducting resonator 202a to superconducting transmission line 110. Superconducting circuit 800a includes capacitors 806a and 806b. Capacitors 806a and 806b can compensate for a local change in the impedance of superconducting transmission line 110. In some implementations, the local change in the impedance is a deviation from 50 Ω

In the implementation illustrated in FIG. 8A, compensating capacitances 806a and 806b are arranged at least approximately symmetrically either side of the inductive coupling in proximity to the inductive coupling. In other implementations, one or more compensating capacitances can be used in a suitable arrangement. Variations in the arrangement can include the number of capacitances, and their placement and spacing with respect to each other and the superconducting resonator.

Figure 8B:
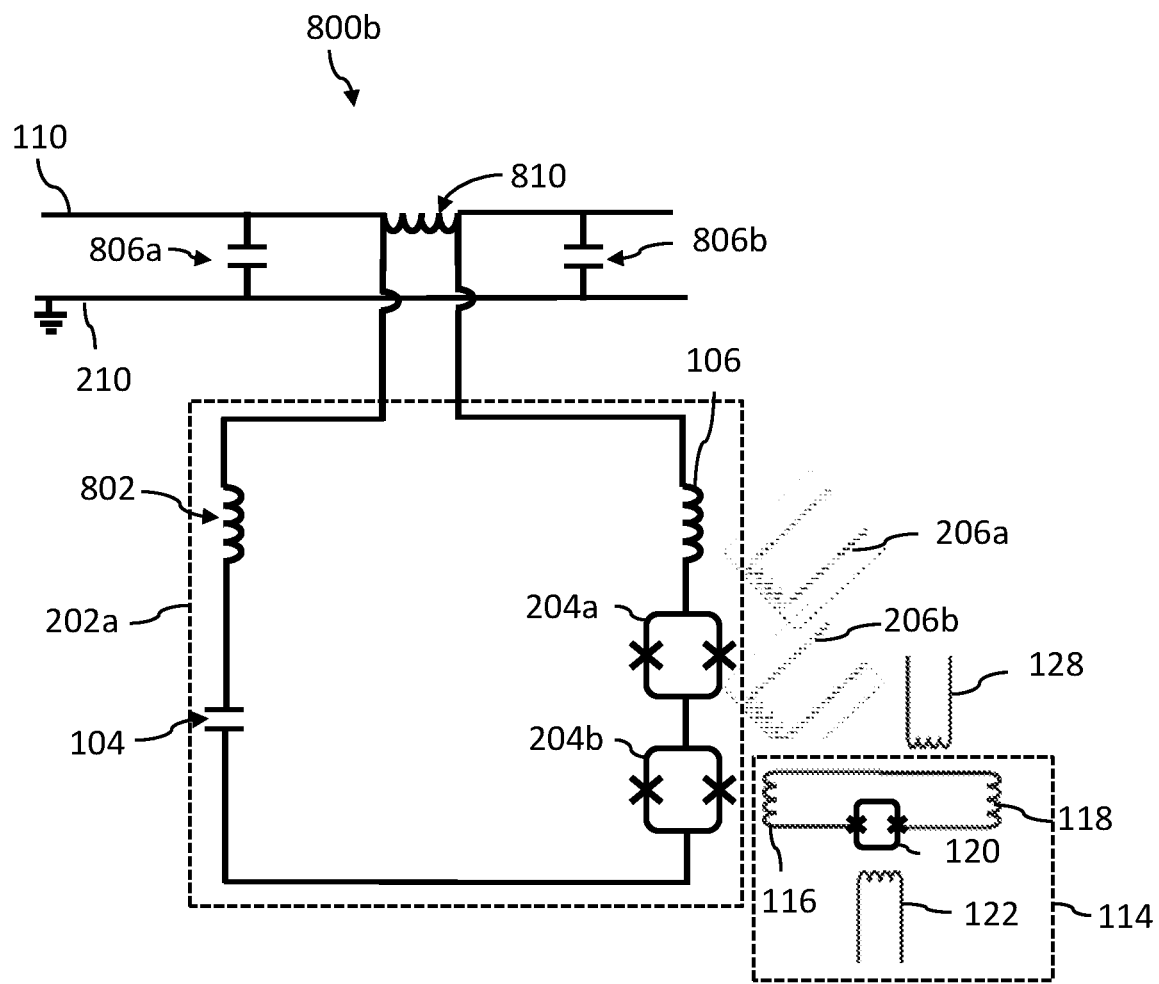
FIG. 8B is a schematic circuit diagram illustrating a second example superconducting circuit of an inductively-coupled resonator according to the present disclosure.

FIG. 8B is a schematic circuit diagram illustrating a second example superconducting circuit 800b of an inductively-coupled resonator according to the present disclosure.

Components of superconducting circuit 800b labeled with the same numbers as in superconducting circuit 800a of FIG. 8A, 100a, 100b of FIGS. 1A and 1B, respectively, and 200a of FIG. 2A are similar or even identical to those described in reference to FIGS. 8A, 1A, 1B, and 2A, respectively.

Superconducting resonator 202a of FIG. 8B is inductively coupled to superconducting transmission line 110 via inductance 810. Superconducting resonator 202a can be galvanically coupled to the inductance. In one implementation, inductance 810 is a kinetic inductance.

Capacitors 806a and 806b can be selected and arranged to compensate for a local perturbation to the characteristic impedance of superconducting transmission line 110. In some implementations, capacitors 806a and 806b are selected and arranged to maintain the characteristic impedance of superconducting transmission line 110 at 50Ω.

Operation of each of superconducting circuits 100, 200a, 200b, 700a, 700a, 700b, 800a, and 800b of FIGS. 1, 2A, 2B, 7A, 7B, 8A, and 8B, respectively, is based at least in part on the use of flux-tunable inductances included in their respective superconducting resonators 202a and 202b. In some implementations, a flux-tunable inductance can be realized using a DC-SQUID that includes two Josephson Junctions fabricated with a tunnel barrier process. A flux-tunable inductance realized using a DC-SQUID is illustrated in each of superconducting circuits 100a, 100b, 200a, 200b, 700a, 700a, 700b, 800a, and 800b of FIGS. 1A, 1B, 2A, 2B, 7A, 7B, 8A, and 8B, respectively.

In other implementations, a tunable inductance can be realized using an RF-SQUID that includes a single Josephson junction in parallel with an inductance. In yet other implementations, a flux-tunable inductance can be realized using an RF-SQUID or a DC-SQUID where the RF-SQUID or DC-SQUID is formed using a combination of one or more inductances selected from a list that includes kinetic inductance, magnetic inductance, tunnel barrier Josephson Junctions, or weak-link Josephson Junctions.

While the specific embodiments and implementations described above provide examples of a superconducting transmission line coupled to one or more tunable superconducting resonators (such as may be used in a FMRR system), the technology described in the present application can be applied more generally to other LC superconducting resonators.

While the specific embodiments and implementations described above provide examples of a superconducting transmission line coupled to one or more superconducting resonators, the technology described in the present applications can be applied more generally to non-superconducting resonators. In the case of non-superconducting resonators, the value of $Q_{EXT}$ can be lower than for superconducting resonators (for example, because there is more damping). A local perturbation of the characteristic impedance of the transmission may be correspondingly less pronounced, and compensation may be less necessary.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to the following: PCT Patent Application No. PCT/US2016/031885 (published as International patent application publication WO2016183213A1), entitled "FREQUENCY MULTIPLEXED RESONATOR INPUT AND/OR OUTPUT FOR A SUPERCONDUCTING DEVICE," filed May 11, 2016; U.S. Pat. No. 8,854,074, entitled "SYSTEMS AND METHODS FOR SUPERCONDUCTING FLUX QUBIT READOUT," granted Oct. 7, 2014; U.S. Pat. No. 8,169,231, entitled "SYSTEMS, METHODS, AND APPARATUS FOR QUBIT STATE READOUT," granted May 1, 2012; and U.S. Provisional Patent Application No. 62/636,043, entitled "SYSTEMS AND METHODS FOR COUPLING A SUPERCONDUCTING TRANSMISSION LINE TO AN ARRAY OF RESONATORS," filed Feb. 27, 2018, all of which are incorporated herein by reference, in their entireties. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting circuit comprising:
   a transmission line, the transmission line comprising at least one transmission line capacitance;
   a superconducting resonator;
   a coupling inductance that inductively communicatively couples the superconducting resonator to the transmission line, wherein the at least one transmission line capacitance includes:
   a first capacitance upstream of the superconducting resonator; and
   a second capacitance downstream of the superconducting resonator, wherein a value of the at least one transmission line capacitance is selected to at least partially compensate for a variation in coupling strength between the superconducting resonator and the transmission line.

2. The superconducting circuit of claim 1, wherein the superconducting resonator comprises:
   a loop of superconducting material comprising;
      a first resonator inductance coupled between the transmission line and a first DC superconducting quantum interference device (SQUID);
      a second DC superconducting quantum interference device (SQUID) coupled between the first DC SQUID and a resonator capacitance; and
      a second resonator inductance coupled between the resonator capacitance and the transmission line.

3. The superconducting circuit of claim 2, further comprising a first interface operable to apply a first flux bias to the first DC SQUID, and a second interface operable to apply a second flux bias to the second DC SQUID.

4. The superconducting circuit of claim 1, wherein a value of at least one of the first and the second capacitance is selected to at least partially compensate for a variation in coupling strength between the superconducting resonator and the transmission line.

5. The superconducting circuit of claim 1, wherein the coupling inductance that inductively communicatively couples the superconducting resonator to the transmission line is a kinetic inductance.

6. The superconducting circuit of claim 1, wherein the superconducting resonator is strongly-coupled to the transmission line.

7. The superconducting circuit of claim 1, wherein the transmission line is a coaxial transmission line.

8. The superconducting circuit of claim 1, wherein the transmission line is a coplanar waveguide.

9. The superconducting circuit of claim 1, operable to readout data from a quantum device.

10. The superconducting circuit of claim 1, operable to load data into a quantum device.

11. The superconducting circuit of claim 1, wherein the transmission line capacitance is proximate the superconducting resonator.

12. The superconducting circuit of claim 1, further comprising:
    a shift register stage; and
    an interface operable to apply a flux bias to the shift register stage.

13. The superconducting circuit of claim 1, wherein the superconducting resonator is one of a plurality of superconducting resonators in an array of superconducting resonators, each of the plurality of superconducting resonators coupled to the transmission line.

14. The superconducting circuit of claim 1, wherein the transmission line is a microwave transmission line, and the superconducting resonator is a microwave superconducting resonator.

* * * * *